US012676607B2

(12) United States Patent
Willard et al.

(10) Patent No.: US 12,676,607 B2
(45) Date of Patent: Jul. 7, 2026

(54) AC COUPLING MODULES FOR BIAS LADDERS

(71) Applicant: pSemi Corporation, San Diego, CA (US)

(72) Inventors: Simon Edward Willard, Irvine, CA (US); Tero Tapio Ranta, San Diego, CA (US); Matt Allison, Oceanside, CA (US); Shashi Ketan Samal, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 133 days.

(21) Appl. No.: 18/466,601

(22) Filed: Sep. 13, 2023

(65) Prior Publication Data

US 2024/0063785 A1     Feb. 22, 2024

Related U.S. Application Data

(63) Continuation of application No. 17/884,252, filed on Aug. 9, 2022, now Pat. No. 11,870,431, which is a
(Continued)

(51) Int. Cl.
*H03K 17/16* (2006.01)
*H03K 17/0412* (2006.01)
(Continued)

(52) U.S. Cl.
CPC ....... *H03K 17/102* (2013.01); *H03K 17/0412* (2013.01); *H03K 17/063* (2013.01);
(Continued)

(58) Field of Classification Search
None
See application file for complete search history.

(56) References Cited

U.S. PATENT DOCUMENTS

| 528,345 | A | 10/1894 | Sebring |
| 3,699,359 | A | 10/1972 | Shelby |

(Continued)

FOREIGN PATENT DOCUMENTS

| EP | 0851561 | A2 | 7/1998 |
| JP | 2002164441 | | 6/2002 |
| JP | 2003535287 | | 11/2003 |
| JP | 2005251931 | A | 9/2005 |
| JP | 5678106 | B2 | 2/2015 |

OTHER PUBLICATIONS

Wells, Kenneth B., Office Action received from the USPTO dated Jan. 18, 2023 for U.S. Appl. No. 17/884,252, 14 pgs.
(Continued)

*Primary Examiner* — Kenneth B Wells
(74) *Attorney, Agent, or Firm* — Haynes and Boone, LLP

(57) ABSTRACT

A positive-logic FET switch stack that does not require a negative bias voltage, exhibits high isolation and low insertion/mismatch loss, and may withstand high RF voltages. Embodiments include a FET stack comprising series-coupled positive-logic FETs (i.e., FETs not requiring a negative voltage supply to turn OFF), series-coupled on at least one end by an "end-cap" FET of a type that turns OFF when its $V_{GS}$ is zero volts. The one or more end-cap FETs provide a selectable capacitive DC blocking function or a resistive signal path. Embodiments include a stack of FETs of only the zero $V_{GS}$ type, or a mix of positive-logic and zero $V_{GS}$ type FETs with end-cap FETs of the zero $V_{GS}$ type. Some embodiments withstand high RF voltages by including combinations of series or parallel coupled resistor ladders for the FET gate resistors, drain-source resistors, body charge control resistors, and one or more AC coupling modules.

17 Claims, 20 Drawing Sheets

Related U.S. Application Data continuation of application No. 17/325,867, filed on May 20, 2021, now Pat. No. 11,418,183, which is a continuation of application No. 16/852,804, filed on Apr. 20, 2020, now Pat. No. 11,018,662, which is a continuation of application No. 16/261,167, filed on Jan. 29, 2019, now Pat. No. 10,630,280, which is a continuation of application No. 15/939,144, filed on Mar. 28, 2018, now Pat. No. 10,236,872.

(51) Int. Cl.

| | |
|---|---|
| *H03K 17/06* | (2006.01) |
| *H03K 17/10* | (2006.01) |
| *H03K 17/687* | (2006.01) |
| *H03K 17/693* | (2006.01) |
| *H04B 1/44* | (2006.01) |
| *H10D 84/80* | (2025.01) |
| *H10D 86/00* | (2025.01) |
| *H10W 90/00* | (2026.01) |

(52) U.S. Cl.

CPC ....... *H03K 17/162* (2013.01); *H03K 17/6871* (2013.01); *H03K 17/6872* (2013.01); *H03K 17/6874* (2013.01); *H03K 17/693* (2013.01); *H10D 84/811* (2025.01); *H10D 86/201* (2025.01); *H10W 90/00* (2026.01); *H03K 2017/066* (2013.01); *H03K 2217/0009* (2013.01); *H03K 2217/0054* (2013.01)

(56) References Cited

U.S. PATENT DOCUMENTS

| | | | |
|---|---|---|---|
| 4,145,719 A | 3/1979 | Hand et al. |
| 4,316,101 A | 2/1982 | Minner |
| 4,746,960 A | 5/1988 | Valeri et al. |
| 4,748,485 A | 5/1988 | Vasudev |
| 4,809,056 A | 2/1989 | Shirato et al. |
| 4,825,145 A | 4/1989 | Tanaka et al. |
| 4,906,587 A | 3/1990 | Blake |
| 4,999,585 A | 3/1991 | Burt et al. |
| 5,001,528 A | 3/1991 | Bahraman |
| 5,095,348 A | 3/1992 | Houston |
| 5,107,152 A | 4/1992 | Jain et al. |
| 5,148,393 A | 9/1992 | Furuyama |
| 5,157,279 A | 10/1992 | Lee |
| 5,313,083 A | 5/1994 | Schindler |
| 5,317,181 A | 5/1994 | Tyson |
| 5,319,604 A | 6/1994 | Imondi et al. |
| 5,405,795 A | 4/1995 | Beyer et al. |
| 5,422,590 A | 6/1995 | Coffman et al. |
| 5,548,239 A | 8/1996 | Kohama |
| 5,553,295 A | 9/1996 | Pantelakis et al. |
| 5,554,892 A | 9/1996 | Norimatsu |
| 5,559,368 A | 9/1996 | Hu et al. |
| 5,576,647 A | 11/1996 | Sutardja et al. |
| 5,578,853 A | 11/1996 | Hayashi et al. |
| 5,581,106 A | 12/1996 | Hayashi et al. |
| 5,594,371 A | 1/1997 | Douseki |
| 5,600,588 A | 2/1997 | Kawashima |
| 5,610,533 A | 3/1997 | Arimoto et al. |
| 5,689,144 A | 11/1997 | Williams |
| 5,729,039 A | 3/1998 | Beyer et al. |
| 5,753,955 A | 5/1998 | Fechner |
| 5,767,549 A | 6/1998 | Chen et al. |
| 5,774,411 A | 6/1998 | Hsieh et al. |
| 5,774,792 A | 6/1998 | Tanaka et al. |
| 5,777,530 A | 7/1998 | Nakatuka |
| 5,784,311 A | 7/1998 | Assaderaghi et al. |
| 5,801,577 A | 9/1998 | Tailliet |
| 5,804,858 A | 9/1998 | Hsu et al. |
| 5,814,899 A | 9/1998 | Okumura et al. |
| 5,818,283 A | 10/1998 | Tonami et al. |
| 5,821,769 A | 10/1998 | Douseki |
| 5,877,978 A | 3/1999 | Morishita et al. |
| 5,878,331 A | 3/1999 | Yamamoto et al. |
| 5,880,620 A | 3/1999 | Gitlin et al. |
| 5,892,260 A | 4/1999 | Okumura et al. |
| 5,892,382 A | 4/1999 | Ueda et al. |
| 5,920,093 A | 7/1999 | Huang et al. |
| 5,930,605 A | 7/1999 | Mistry et al. |
| 5,945,867 A | 8/1999 | Uda et al. |
| 5,959,335 A | 9/1999 | Bryant et al. |
| 5,973,364 A | 10/1999 | Kawanaka |
| 5,986,518 A | 11/1999 | Dougherty |
| 6,020,778 A | 2/2000 | Shigehara et al. |
| 6,049,110 A | 4/2000 | Koh |
| 6,061,267 A | 5/2000 | Houston |
| 6,063,686 A | 5/2000 | Masuda et al. |
| 6,066,993 A | 5/2000 | Yamamoto et al. |
| 6,081,443 A | 6/2000 | Morishita et al. |
| 6,084,255 A | 7/2000 | Ueda et al. |
| 6,087,893 A | 7/2000 | Oowaki et al. |
| 6,094,088 A | 7/2000 | Yano |
| 6,100,564 A | 8/2000 | Bryant et al. |
| 6,104,061 A | 8/2000 | Forbes et al. |
| 6,111,778 A | 8/2000 | MacDonald et al. |
| 6,130,570 A | 10/2000 | Pan et al. |
| 6,137,367 A | 10/2000 | Ezzedine et al. |
| 6,172,378 B1 | 1/2001 | Hull et al. |
| 6,191,449 B1 | 2/2001 | Shino |
| 6,201,761 B1 | 3/2001 | Wollesen |
| 6,218,248 B1 | 4/2001 | Hwang et al. |
| 6,218,892 B1 | 4/2001 | Soumyanath et al. |
| 6,222,394 B1 | 4/2001 | Allen et al. |
| 6,239,649 B1 | 5/2001 | Bertin et al. |
| 6,249,029 B1 | 6/2001 | Bryant et al. |
| 6,281,737 B1 | 8/2001 | Kuang et al. |
| 6,300,796 B1 | 10/2001 | Troutman et al. |
| 6,304,110 B1 | 10/2001 | Hirano |
| 6,308,047 B1 | 10/2001 | Yamamoto et al. |
| 6,310,508 B1 | 10/2001 | Westerman |
| 6,316,983 B1 | 11/2001 | Kitamura |
| 6,320,225 B1 | 11/2001 | Hargrove et al. |
| 6,341,087 B1 | 1/2002 | Kunikiyo |
| 6,355,957 B1 | 3/2002 | Maeda et al. |
| 6,356,536 B1 | 3/2002 | Repke |
| 6,365,488 B1 | 4/2002 | Liao |
| 6,380,793 B1 | 4/2002 | Bancal et al. |
| 6,380,796 B2 | 4/2002 | Sakai et al. |
| 6,387,739 B1 | 5/2002 | Smith, III |
| 6,392,440 B2 | 5/2002 | Nebel |
| 6,392,467 B1 | 5/2002 | Oowaki et al. |
| 6,396,325 B2 | 5/2002 | Goodell |
| 6,407,427 B1 | 6/2002 | Oh |
| 6,407,614 B1 | 6/2002 | Takahashi |
| 6,411,156 B1 | 6/2002 | Borkar et al. |
| 6,414,353 B1 | 7/2002 | Maeda et al. |
| 6,429,487 B1 | 8/2002 | Kunikiyo |
| 6,433,587 B1 | 8/2002 | Assaderaghi et al. |
| 6,433,589 B1 | 8/2002 | Lee |
| 6,461,902 B1 | 10/2002 | Xu et al. |
| 6,466,082 B1 | 10/2002 | Krishnan |
| 6,469,568 B2 | 10/2002 | Toyoyama et al. |
| 6,486,511 B1 | 11/2002 | Nathanson et al. |
| 6,498,058 B1 | 12/2002 | Bryant et al. |
| 6,498,370 B1 | 12/2002 | Kim et al. |
| 6,504,213 B1 | 1/2003 | Ebina |
| 6,512,269 B1 | 1/2003 | Bryant et al. |
| 6,518,645 B2 | 2/2003 | Bae et al. |
| 6,521,959 B2 | 2/2003 | Kim et al. |
| 6,537,861 B1 | 3/2003 | Kroell et al. |
| 6,563,366 B1 | 5/2003 | Kohama |
| 6,573,533 B1 | 6/2003 | Yamazaki |
| 6,608,785 B2 | 8/2003 | Chuang et al. |
| 6,608,789 B2 | 8/2003 | Sullivan et al. |
| 6,642,578 B1 | 11/2003 | Arnold et al. |
| 6,646,305 B2 | 11/2003 | Assaderaghi et al. |
| 6,670,655 B2 | 12/2003 | Lukes et al. |
| 6,677,803 B1 | 1/2004 | Chiba |
| 6,684,065 B2 | 1/2004 | Bult et al. |
| 6,693,498 B1 | 2/2004 | Sasabata et al. |

(56) References Cited

U.S. PATENT DOCUMENTS

| | | | |
|---|---|---|---|
| 6,698,082 B2 | 3/2004 | Crenshaw et al. | |
| 6,703,863 B2 | 3/2004 | Gion | |
| 6,704,550 B1 | 3/2004 | Kohama et al. | |
| 6,711,397 B1 | 3/2004 | Petrov et al. | |
| 6,762,477 B2 | 7/2004 | Kunikiyo | |
| 6,774,701 B1 | 8/2004 | Heston et al. | |
| 6,781,805 B1 | 8/2004 | Urakawa | |
| 6,803,680 B2 | 10/2004 | Brindle et al. | |
| 6,830,963 B1 | 12/2004 | Forbes | |
| 6,836,172 B2 | 12/2004 | Okashita | |
| 6,870,241 B2 | 3/2005 | Nakatani et al. | |
| 6,882,210 B2 | 4/2005 | Asano et al. | |
| 6,897,701 B2 | 5/2005 | Chen et al. | |
| 6,903,596 B2 | 6/2005 | Geller et al. | |
| 6,917,258 B2 | 7/2005 | Kushitani et al. | |
| 6,933,744 B2 | 8/2005 | Das et al. | |
| 6,975,271 B2 | 12/2005 | Adachi et al. | |
| 6,978,122 B2 | 12/2005 | Kawakyu et al. | |
| 7,042,245 B2 | 5/2006 | Hidaka | |
| 7,045,873 B2 | 5/2006 | Chen et al. | |
| 7,057,472 B2 | 6/2006 | Fukamachi et al. | |
| 7,082,293 B1 | 7/2006 | Rofougaran et al. | |
| 7,092,677 B1 | 8/2006 | Zhang et al. | |
| 7,123,898 B2 | 10/2006 | Burgener et al. | |
| 7,129,545 B2 | 10/2006 | Cain et al. | |
| 7,132,873 B2 | 11/2006 | Hollmer | |
| 7,138,846 B2 | 11/2006 | Suwa et al. | |
| 7,173,471 B2 | 2/2007 | Nakatsuka et al. | |
| 7,199,635 B2 | 4/2007 | Nakatsuka et al. | |
| 7,266,014 B2 | 9/2007 | Wu et al. | |
| 7,269,392 B2 | 9/2007 | Nakajima et al. | |
| 7,345,342 B2 | 3/2008 | Challa et al. | |
| 7,345,521 B2 | 3/2008 | Takahashi et al. | |
| 7,355,455 B2 | 4/2008 | Hidaka | |
| 7,405,982 B1 | 7/2008 | Hsu et al. | |
| 7,432,552 B2 | 10/2008 | Park et al. | |
| 7,460,852 B2 | 12/2008 | Burgener et al. | |
| 7,492,209 B2 | 2/2009 | Prikhodko et al. | |
| 7,561,853 B2 | 7/2009 | Miyazawa | |
| 7,613,442 B1 | 11/2009 | Kelly et al. | |
| 7,619,462 B2 | 11/2009 | Kelly et al. | |
| 7,741,869 B2 | 6/2010 | Hidaka | |
| 7,796,969 B2 | 9/2010 | Kelly et al. | |
| 7,860,499 B2 | 12/2010 | Burgener et al. | |
| 7,890,891 B2 | 2/2011 | Stuber et al. | |
| 7,910,993 B2 | 3/2011 | Brindle et al. | |
| 7,928,759 B2 | 4/2011 | Hidaka | |
| 8,081,928 B2 | 12/2011 | Kelly | |
| 8,129,787 B2 | 3/2012 | Brindle et al. | |
| 8,373,490 B2 * | 2/2013 | Burgener | H03C 1/36 |
| | | | 327/361 |
| 8,451,044 B2 | 5/2013 | Nisbet et al. | |
| 8,525,272 B2 | 9/2013 | Losehand et al. | |
| 8,527,949 B1 | 9/2013 | Pleis et al. | |
| 8,669,804 B2 | 3/2014 | Ranta et al. | |
| 8,729,949 B2 | 5/2014 | Nisbet et al. | |
| 8,742,502 B2 | 6/2014 | Brindle et al. | |
| 8,954,902 B2 | 2/2015 | Stuber et al. | |
| 9,087,899 B2 | 7/2015 | Brindle et al. | |
| 9,129,836 B2 | 9/2015 | Losehand et al. | |
| 9,130,564 B2 | 9/2015 | Brindle et al. | |
| 9,225,378 B2 | 12/2015 | Burgener et al. | |
| 9,397,656 B2 | 7/2016 | Dribinsky et al. | |
| 9,438,223 B2 | 9/2016 | de Jongh | |
| 9,780,775 B2 | 10/2017 | Brindle et al. | |
| 9,786,781 B2 | 10/2017 | Brindle et al. | |
| 9,843,293 B1 * | 12/2017 | Wagh | H03F 1/223 |
| 9,887,695 B2 | 2/2018 | Dribinsky et al. | |
| 9,948,281 B2 | 4/2018 | Ranta | |
| 10,236,872 B1 | 3/2019 | Willard et al. | |
| 10,270,437 B2 | 4/2019 | Scott | |
| 10,505,530 B2 | 12/2019 | Ranta et al. | |
| 10,630,280 B2 | 4/2020 | Willard et al. | |
| 10,886,911 B2 | 1/2021 | Willard et al. | |
| 11,018,662 B2 | 5/2021 | Willard et al. | |
| 11,418,183 B2 | 8/2022 | Willard et al. | |
| 11,870,431 B2 | 1/2024 | Willard et al. | |
| 2001/0031518 A1 | 10/2001 | Kim et al. | |
| 2001/0040479 A1 | 11/2001 | Zhang | |
| 2002/0029971 A1 | 3/2002 | Kovacs | |
| 2002/0115244 A1 | 8/2002 | Park et al. | |
| 2002/0126767 A1 | 9/2002 | Ding et al. | |
| 2003/0002452 A1 | 1/2003 | Sahota | |
| 2003/0141543 A1 | 7/2003 | Bryant et al. | |
| 2003/0160515 A1 | 8/2003 | Yu et al. | |
| 2003/0181167 A1 | 9/2003 | Iida | |
| 2003/0201494 A1 | 10/2003 | Maeda et al. | |
| 2003/0222313 A1 | 12/2003 | Fechner | |
| 2003/0227056 A1 | 12/2003 | Wang et al. | |
| 2004/0021137 A1 | 2/2004 | Fazan et al. | |
| 2004/0051114 A1 * | 3/2004 | Brindle | H01L 27/0629 |
| | | | 257/E27.016 |
| 2004/0061130 A1 | 4/2004 | Morizuka | |
| 2004/0080364 A1 | 4/2004 | Sander et al. | |
| 2004/0129975 A1 | 7/2004 | Koh et al. | |
| 2004/0227565 A1 | 11/2004 | Chen et al. | |
| 2004/0242182 A1 | 12/2004 | Hidaka et al. | |
| 2005/0017789 A1 | 1/2005 | Burgener et al. | |
| 2005/0077564 A1 | 4/2005 | Forbes | |
| 2005/0079829 A1 | 4/2005 | Ogawa et al. | |
| 2005/0121699 A1 | 6/2005 | Chen et al. | |
| 2005/0127442 A1 | 6/2005 | Veeraraghavan et al. | |
| 2005/0179506 A1 | 8/2005 | Takahashi et al. | |
| 2005/0212595 A1 | 9/2005 | Kusunoki et al. | |
| 2005/0264341 A1 | 12/2005 | Hikita et al. | |
| 2006/0009164 A1 | 1/2006 | Kataoka | |
| 2006/0022526 A1 | 2/2006 | Cartalade | |
| 2006/0194558 A1 | 8/2006 | Kelly | |
| 2006/0194567 A1 | 8/2006 | Kelly et al. | |
| 2006/0267093 A1 | 11/2006 | Tang et al. | |
| 2007/0069291 A1 | 3/2007 | Stuber et al. | |
| 2007/0120103 A1 | 5/2007 | Burgener et al. | |
| 2007/0290744 A1 | 12/2007 | Adachi et al. | |
| 2008/0076371 A1 | 3/2008 | Dribinsky et al. | |
| 2008/0191788 A1 | 8/2008 | Chen et al. | |
| 2009/0117871 A1 | 5/2009 | Burgener et al. | |
| 2010/0327948 A1 | 12/2010 | Nisbet | |
| 2011/0163779 A1 | 7/2011 | Hidaka | |
| 2011/0169550 A1 | 7/2011 | Brindle et al. | |
| 2011/0227637 A1 | 9/2011 | Stuber et al. | |
| 2012/0169398 A1 | 7/2012 | Brindle et al. | |
| 2012/0267719 A1 | 10/2012 | Brindle et al. | |
| 2013/0015717 A1 | 1/2013 | Dykstra | |
| 2013/0293280 A1 | 11/2013 | Brindle et al. | |
| 2014/0118053 A1 * | 5/2014 | Matsuno | H03K 17/693 |
| | | | 327/427 |
| 2014/0167834 A1 | 6/2014 | Stuber et al. | |
| 2014/0179374 A1 | 6/2014 | Burgener et al. | |
| 2014/0312422 A1 | 10/2014 | Brindle et al. | |
| 2015/0015321 A1 | 1/2015 | Dribinsky et al. | |
| 2015/0381171 A1 | 12/2015 | Cebi et al. | |
| 2016/0064561 A1 | 3/2016 | Brindle et al. | |
| 2016/0085256 A1 | 3/2016 | Cam | |
| 2016/0191040 A1 | 6/2016 | Brindle et al. | |
| 2016/0226478 A1 | 8/2016 | Dribinsky et al. | |
| 2016/0329891 A1 * | 11/2016 | Bakalski | H03K 17/693 |
| 2017/0134016 A1 | 5/2017 | Ranta | |
| 2017/0201248 A1 * | 7/2017 | Scott | H03K 17/145 |
| 2017/0272066 A1 | 9/2017 | Scott et al. | |
| 2017/0338321 A1 | 11/2017 | Hurwitz et al. | |
| 2018/0114801 A1 | 4/2018 | Leipold et al. | |
| 2018/0175851 A1 | 6/2018 | Kerr et al. | |
| 2019/0305769 A1 | 10/2019 | Willard et al. | |
| 2020/0321955 A1 | 10/2020 | Willard et al. | |
| 2021/0344338 A1 | 11/2021 | Willard et al. | |
| 2023/0032891 A1 | 2/2023 | Willard et al. | |
| 2025/0150073 A1 | 5/2025 | Willard et al. | |

OTHER PUBLICATIONS

Wells, Kenneth B., Notice of Allowance received from the USPTO dated May 3, 2023 for U.S. Appl. No. 17/884,252, 207 pgs.

(56)          References Cited

OTHER PUBLICATIONS pSEMI Corporation, Preliminary Amendment filed in the USPTO dated Oct. 19, 2022 for U.S. Appl. No. 17/884,252, 6 pgs.

pSEMI Corporation, Response filed in the USPTO dated Apr. 18, 2023 for U.S. Appl. No. 17/884,252, 10 pgs.

Adan, et al., "Linearity and Low-Noise Performance of SOI MOSFETs for RF Applications", IEEE Transactions on Electron Devices, vol. 49, No. 5, May 2002, pp. 881-888.

Adan, et al., "OFF-State Leakage Current Mechanisms in BulkSi and SOI MOSFETs and Their Impact on CMOS ULSIs Standby Current", IEEE Transactions on Electron Devices, vol. 48, No. 9, Sep. 2001, pp. 2050-2057.

Adriaensen, et al., "Analysis and Potential of the Bipolar- and Hybrid-Mode Thin-Film SOI MOSFETs for High-Temperature Applications", Laboraloire de Microelectronique, Universite catholique de Louvain, May 2001, 5 pgs.

Akarvardar, et al., "Multi-Bias Dependence of Threshold Voltage, Subthreshold Swing, and Mobility in G4-FETs", Institute of Microelectronics, Electromagnetism, and Photonics, IEEE 2003, pp. 127-130.

Akarvardar, et al., "Threshold Voltage Model of the SOI 4-Gate Transistor", 2004 IEEE International SOI Conference, 10/04, pp. 89-90.

Allen, Thomas P., "Characterization and Modeling of Silicon-On-Insulator Field Effect Transistors", Department of Electrical Engineering and Computer Science, MIT, May 20, 1999, 80 pgs.

Ayasli, et al., "A Monolithic Single-Chip X-Band Four-Bil Phase Shifter", IEEE Transactions on Microwave Theory and Techniques, vol. MTT-30, No. 12, Dec. 1982, pp. 2201-2206.

Ayasli, et al., "An X-Band 10 W Monolithic Transmit-Receive GaAs FET Switch", Raytheon Research Division, 1982 IEEE, pp. 42-46.

Bawedin, et al., "Unusual Floating Body Effect in Fully Depleted MOSFETs", IMEP, Enserg, France and Microelectronics Laboratory, UCL, Belgium, Oct. 2004, 22 pgs.

Bernkopf, et al., "A High Power K/Ka-Band Monolithic T/R Switch", 1991 IEEE, IEEE 1991 Microwave and Millimeter-Wave Monolithic Circuits Symposium, pp. 15-18.

Cathelin, et al., "Antenna Switch Devices in RF Modules for Mobile Applications", ST Microelectronics, Front-End Technology and Manufacturing, Crolles, France, Mar. 2005, 42 pgs.

Chan, et al., "A Novel SOI CBiCMOS Compatible Device Structure for Analog and Mixed-Mode Circuits", Dept. of EECS, University of California at Berkeley, IEEE 1995, pp. 40-43.

Chen, Suheng, "G4-FET Based Voltage Reference", Masters Theses, University of Tennessee, Knoxville, Trace: Tennessee Research and Creative Exchange, May 2004, 57 pgs.

Cheng, et al., "Gate-Channel Capacitance Characteristics in the Fully-Depleted SOI MOSFET", IEEE Transactions on Electron Devices, vol. 48, No. 2, Feb. 2001, pp. 388-391.

Colinge, Jean-Pierre, "An SOI Voltage-Controlled Bipolar-MOS Device", IEEE Transactions on Electron Devices, vol. ED-34, No. 4, Apr. 1987, pp. 845-849.

Cristoloveanu, et al., "The Four-Gate Transistor", Institute of Microelectronics, Electromagnetism and Photonics, ESSDERC 2001, pp. 323-326.

Cristoloveanu, Sorin, "State-Of-the-art and Future of Silicon on Insulator Technologies, Materials, and Devices", Microelectronics Reliability 40 (2000), pp. 771-777.

Dehan, et al., "Alternative Architectures of SOI MOSFET for Improving DC and Microwave Characteristics", Microwave Laboratory, Universite catholique de Louvain, Sep. 2001, 4 pgs.

Dehan, et al., "Dynamic Threshold Voltage MOS in Partially Depleted SOI Technology: A Wide Frequency Band Analysis", Solid-Slate Electronics 49 (2005), pp. 67-72.

Drake, et al., "Analysis of the Impact of Gate-Body Signal Phase on DTMOS Inverters in 0.13um PD-SOI", Department of EECS, University of Michican, Ann Arbor, MI, Sep./Oct. 2003, 16 pgs.

Drake, et al., "Analysis of the Impact of Gate-Body Signal Phase on DTMOS Inverters in 0.13um PD-SOI", Department of EECS, University of Michigan, Ann Arbor, MI, Sep./Oct. 2003, 4 pgs.

Drake, et al., Evaluation of Dynamic-Threshold Logic for Low-Power VLSI Design in 0.13um PD-SOI, University of Michigan, Ann Arbor, MI, Dec. 2003, 29 pgs.

Dufrene, et al., "Investigation of the Four-Gate Action in G4-FETs", IEEE Transactions on Electron Devices, vol. 51, No. 11, Nov. 2004, pp. 1931-1935.

Dufrene, et al., "The G4-FET: Low Voltage to High Voltage Operation and Performance", Dept. of Electrical and Computer Engineering, The University of Tennessee, IEEE 2003, pp. 55-56.

Ferlet-Cavrois, et al., "High Frequency Characterization of SOI Dynamic Threshold Voltage MOS (DTMOS) Transistors", 1999 IEEE International SOI Conference, Oct. 1999, pp. 24-25.

Flandre, et al., "Design of EEPROM Memory Cells in Fully Depleted 'CMOS SOI Technology'", Catholic University of Louvain Faculty of Applied Science, Laboratory of Electronics and Microelectronics, Academic Year 2003-2004, 94 pgs.

Fung, et al., "Frequency Dispersion in Partially Depleted Soi Mosfet Output Resistance", Proceedings 1996 IEEE International SOI Conference, Oct. 1996, pp. 146-147.

Fung, et al., "Present Status and Future Direction of BSIM SOIL Model for High-Performance/Low-Power/RF Application", IBM Microelectronics, Semiconductor Research and Development Center, Apr. 2002, 4 pgs.

Gentinne, et al., "Measurement and Two-Dimensional Simulation of Thin-Film SOI MOSETs: Intrinsic Gate Capacitances at Elevated Temperatures", Solid-Slate Electronics, vol. 39, No. 11, pp. 1613-1619, 1996.

Han, et al., "A Simple and Accurate Method for Extracting Substrate Resistance of RF MOSFETs", IEEE Electron Device Letters, vol. 23, No. 7, Jul. 2002, pp. 434-436.

Houng, et al., "60-70 dB Isolation 2-19 GHz Switches", Raytheon Electromagnetic Systems Division, 1989 IEEE, GaAs IC Symposium, pp. 173-176.

Imam, et al., "A Simple Method to Determine the Floating-Body Voltage of SOI CMOS Devices", IEEE Electron Device Letters, vol. 21, No. 1, Jan. 2000, pp. 21-23.

Ionescu, et al., "A Physical Analysis of Drain Current Transients at Low Drain Voltage in Thin Film SOI MOSFETs", Microelectronic Engineering 28 (1995), pp. 431-434.

Koo, Raymond, "RF Switches", Univ. Toronto, Elec. And Computer Engineering Dept. 2001, 12 pgs.

Kuroda, et al., "A 0.9-V, 150-MHz, 10-mW, 4 mm2, 2-D Discrete Cosine Transform Core Processor with Variable-Threshold-Voltage Scheme", Technical Paper, 1996 IEEE International Solid-Slate Circuits Conference, 1996 Digest of Technical Papers, pp. 166-167.

Kuroda, et al., "A 0.9-V, 150-MHz, 10-mW, 4 mm2, 2-D Discrete Cosine Transform Core Processor with Variable Threshold-Voltage {VT) Scheme", IEEE Journal of Solid-Slate Circuits, vol. 31, No. 11, Nov. 1996, pp. 1770-1779.

Lederer, et al., "Frequency degradation of SOI MOS device output conductance", Microwave Laboratory of UCL, Belgium, IEEE 2003, pp. 76-77.

Lederer, et al., "Frequency degradation of SOI MOS device output conductance", Microwave Laboratory of Universite catholique de Louvain, Belgium, Sep./Oct. 2003, 1 pg.

Lim, et al., "Partial SOI LDMOSFETs for High-Side Switching", Dept. of Engineering, University of Cambridge, 1999 IEEE, pp. 149-152.

Marks, Jeffery Earl, "SOI for Frequency Synthesis in RF Integrated Circuits", Thesis submitted to North Carolina State University, 2003, 155 pgs.

McGrath, et al., "Novel High Performance SPOT Power Switches using Multi-Gate FETs", 1991 IEEE, MTT-S Digest, pp. 839-842.

Ming Zhu, et al., "A New Structure of Silicon-on-Insulator Metal-Oxide-Semiconductor Field Effect Transistor to Suppress the Floating Body Effect", Chin. Phys. Lett., vol. 20, No. 5 (2003), pp. 767-769.

(56)        References Cited

OTHER PUBLICATIONS

Mizutani, et al., "Compact DC-60-GHz HJFET MMIC Switches using Ohmic Electrode-Sharing Technology", IEEE Transactions on Microwave Theory and Techniques, vol. 46, No. 11, Nov. 1998, pp. 1597-1603.

Moye, et al., "A Compact Broadband, Six-Bit MMIC Phaser with Integrated Digital Drivers+", IEEE 1990 Microwave and Millimeter-Wave Monolithic Circuits Symposium, 1988 IEEE, pp. 123-126.

Ota, et al., "High Isolation and Low Insertion Loss Switch IC Using GaAs MESFETs", IEEE Transactions on Microwave Theory and Techniques, vol. 43, No. 9, Sep. 1995, pp. 2175-2177.

Pelella, et al., "Analysis and Control of Hysteresis in PD/SOI CMOS", University of Florida, Gainesville, FL., 1999 IEEE, pp. 34.5.1 through 34.5.4.

Pucel, et al., "A Multi-Chip GaAs Monolithic Transmit/Receive Module for X-Band", Research Division, Raytheon Company, 1982 IEEE MTT-S Digest, pp. 489-492.

Rossek, Sacha, "Direct Optical Control of a Microwave Phase Shiller Using GaAs Field-Effect Transistors", Communications Research Group, School of Electronic Engineering, Faculty of Technology, Middlesex University, Sep. 1998, 224 pgs.

Scheinberg, et al., "A Computer Simulation Model for Simulating Distortion in FET Resistors", IEEE Transactions on Computer-Aided Design of Integrated Circuits and Systems, vol. 19, No. 9, Sep. 2000, pp. 981-989.

Schindler, et al., "A 2-18 GHz Non-Blocking Active 2 X 2 Switch", Raytheon Company, 1989 IEEE, GaAs IC Symposium, pp. 181-183.

Schindler, et al., "A Single Chip 2-20 Ghz T/R Module" IEEE 1990 Microwave and Millimeter-Wave Monolithic Circuits Symposium, pp. 99-102.

Schindler, et al., "DC-20 GHz N X M Passive Switches", IEEE Transactions on Microwave Theory and Techniques, vol. 36, No. 12, Dec. 1988, pp. 1604-1613.

Schindler, et al., "DC-20 GHZ N X M Passive Switches", Raytheon Co., 1998 IEEE MTT-S Digest, pp. 1001-1005.

Schindler, et al., "DC-40 GHz and 20-40 GHz MMIC SPOT Switches", IEEE Transactions of Electron Devices, vol. ED-34, No. 12, Dec. 1987, pp. 2595-2602.

Sivaram, et al., "Silicon Film Thickness Considerations in SOI-DTMOS", IEEE Device Letters, vol. 23, No. 5, May 2002, pp. 276-278.

Smuk, et al., "Monolithic GaAs Multi-Throw Switches with Integrated Low-Power Decoder-Driver Logic", Hittite Microwave Corporation, Jun. 1997, 4 pgs.

Soyuer, et al., "RF and Microwave Building Blocks in a Standard BiCMOS Technology", IBM T.J. Watson Research Center, 1996 IEEE, pp. 89-92.

Street, A.M., "RF Switch Design", The Institution of Electrical Engineers, 2000, pp. 4/1-4/7.

Streetman, et al., "Solid State Electronic Devices", Microelectronics Research Center, Dept. of Electrical and Computer Engineering, The University of Texas at Austin, Chapter 6, 2004 by Pearson Education Inc., 4 pgs.

Su, et al., "On the Prediction of Geometry-Dependent Floating-Body Effect in SOI MOSFETs", IEEE Transactions on Electron Devices, vol. 52, No. 7, Jul. 2005, pp. 1662-1664.

Suh, et al., "A Physical Charge-Based Model for Non-Fully Depleted SOI MOSFET's and Its Use in Assessing Floating-Body Effects in SOI CMOS Circuits", IEEE Transactions on Electron Devices, vol. 42, No. 4, Apr. 1995, pp. 728-737.

Terauchi, et al., "A 'Self-Body-Bias' SOI MOSFET: A Novel Body-Voltage-Controlled SOI MOSFET for Low Voltage Applications", The Japan Society of Applied Physics, vol. 42 (2003), pp. 2014-2019, Part 1, No. 4B, Apr. 2003.

Titus, et al., "A Silicon BICMOS Transceiver Front-End MMIC Covering 900 and 1900 MHZ Applications", Hittite Microwave Corporation, IEEE 1996 Microwave and Millimeter-Wave Monolithic Circuits Symposium, pp. 73-76.

Tojkumitsu, et al., "A Low-Voltage, High-Power T/R-Switch MMIC Using LC Resonators", IEEE Transactions on Microwave Theory and Techniques, vol. 43, No. 5, May 1995, pp. 997-1003.

Wang, et al., "A Robust Large Signal Non-Quasi-Static MOSFET Model for Circuit Simulation", IEEE 2004 Custom Integrated Circuits Conference, pp. 2-1-1 through 2-1-4.

Wei, et al., "Large-Signal Model of Triple-Gate MESFET/PHEMT for Switch Applications", Alpha Industries, Inc., 1999 IEEE, pp. 745-748.

Weigand, Christopher, "An ASIC Driver for GaAs FET Control Components", Technical Feature, Applied Microwave & Wireless, 2000, pp. 42-48.

Yeh, et al., "High Performance 0.1um Partially Depleted SOI CMOSFET", 2000 IEEE International SOI Conference, Oct. 2000, pp. 68-69.

Zhu, et al., "Simulation of Suppression of Floating-Body Effect in Partially Depleted SOI MOSFET Using a Si1-xGex Dual Source Structure", Materials Science and Engineering B 114-115 (2004), pp. 264-268.

"Positive Bias GaAs Multi-Throw Switches with Integrated TTL Decoders" Hittite Microwave Corporation, Feb. 2001.

* cited by examiner

_100_

RF<sub>IN</sub>                    104            102            104              RF<sub>OUT</sub>

106

*400*

| Stack State | Vgate* | Vdrain* |
|---|---|---|
| ON | 3V | 0V |
| OFF | 0V | 3V |
| * voltages with respect to circuit ground | | |

ON State                                    OFF State

Providing one or more series-coupled positive-logic FETs　902

Providing a first end-cap FET of a type that turns OFF when the VGS of such end-cap FET is essentially zero volts, series-coupled to a first end of the one or more series-coupled positive-logic FETs.　904

_1000_

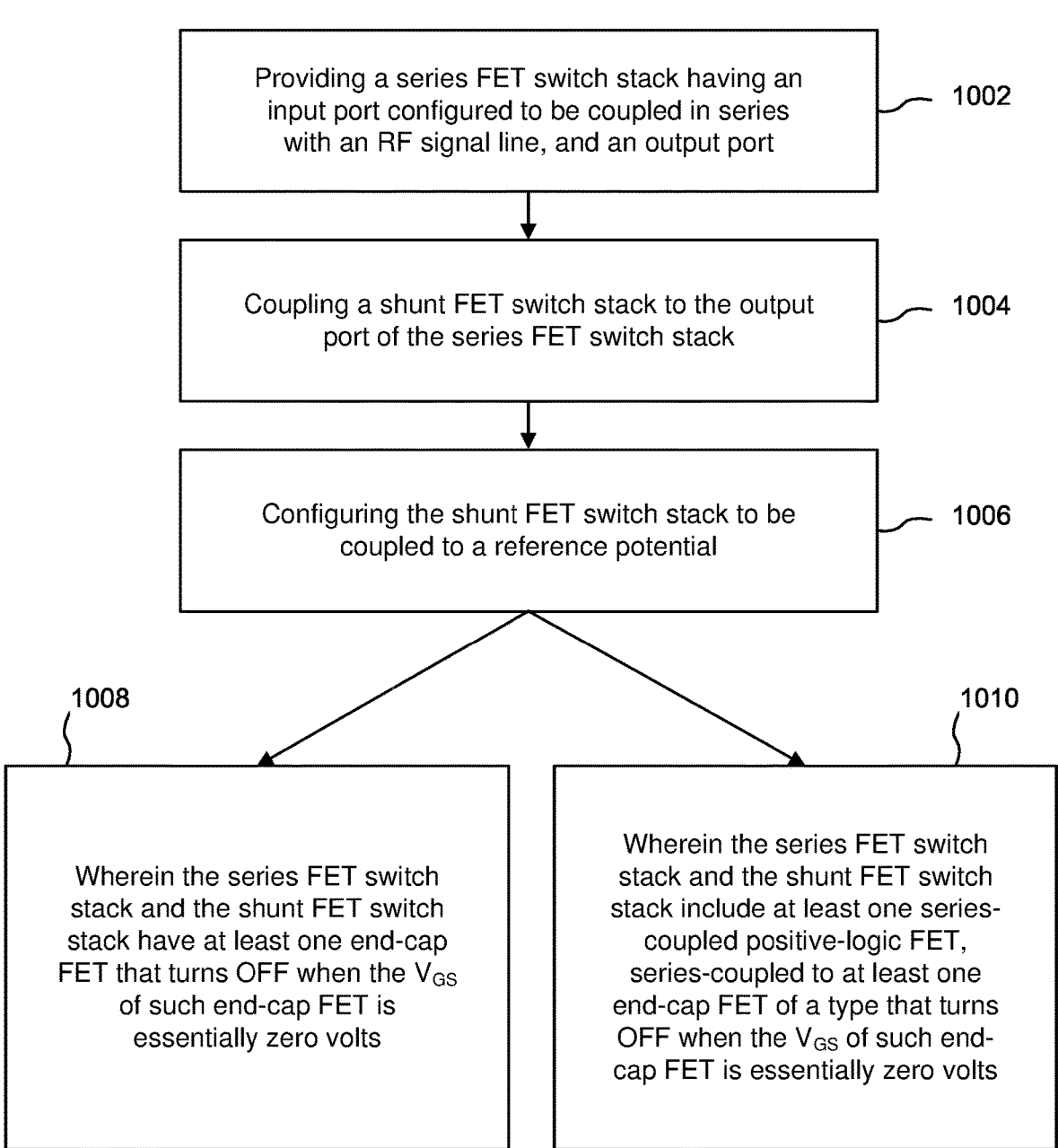

Providing a series FET switch stack having an input port configured to be coupled in series with an RF signal line, and an output port — 1002

Coupling a shunt FET switch stack to the output port of the series FET switch stack — 1004

Configuring the shunt FET switch stack to be coupled to a reference potential — 1006

1008
Wherein the series FET switch stack and the shunt FET switch stack have at least one end-cap FET that turns OFF when the $V_{GS}$ of such end-cap FET is essentially zero volts 1010
Wherein the series FET switch stack and the shunt FET switch stack include at least one series-coupled positive-logic FET, series-coupled to at least one end-cap FET of a type that turns OFF when the $V_{GS}$ of such end-cap FET is essentially zero volts

FIG. 10

*1100*

```
┌─────────────────────────────────────────────────┐
│     Providing a plurality of series-coupled FETs │ ─── 1102
└─────────────────────────────────────────────────┘
                         │
                         ▼
┌─────────────────────────────────────────────────┐
│   Providing a gate bias resistor ladder including a │
│   plurality of resistors configured to be coupled to │ ─── 1104
│   a gate bias voltage and to the gate of at least    │
│             one corresponding FET                    │
└─────────────────────────────────────────────────┘
                         │
                         ▼
┌─────────────────────────────────────────────────┐
│  Providing a body charge control resistor ladder    │
│  including a plurality of resistors configured to be │ ─── 1106
│  coupled to a body bias voltage and to the body      │
│        of at least one corresponding FET             │
└─────────────────────────────────────────────────┘
                         │
                         ▼
┌─────────────────────────────────────────────────┐
│     Providing a drain-source resistor ladder        │
│   including a plurality of series-coupled resistors  │
│   configured to be coupled to a drain-source bias    │ ─── 1108
│   voltage, wherein each resistor is coupled to the   │
│   respective drains and sources of at least one      │
│        corresponding adjacent FETs,                  │
└─────────────────────────────────────────────────┘
```

1110

1112

```
┌──────────────────────────┐        ┌──────────────────────────┐
│  Wherein the resistors of │        │  Wherein the resistors of │
│  the gate bias resistor   │        │  the gate bias resistor   │
│  ladder are series-       │        │  ladder are parallel-     │
│  connected and the        │        │  connected and the        │
│  resistors of the body    │        │  resistors of the body    │
│  charge control resistor  │        │  charge control resistor  │
│  ladder are parallel-     │        │  ladder are series-       │
│  connected                │        │  connected                │
└──────────────────────────┘        └──────────────────────────┘
```

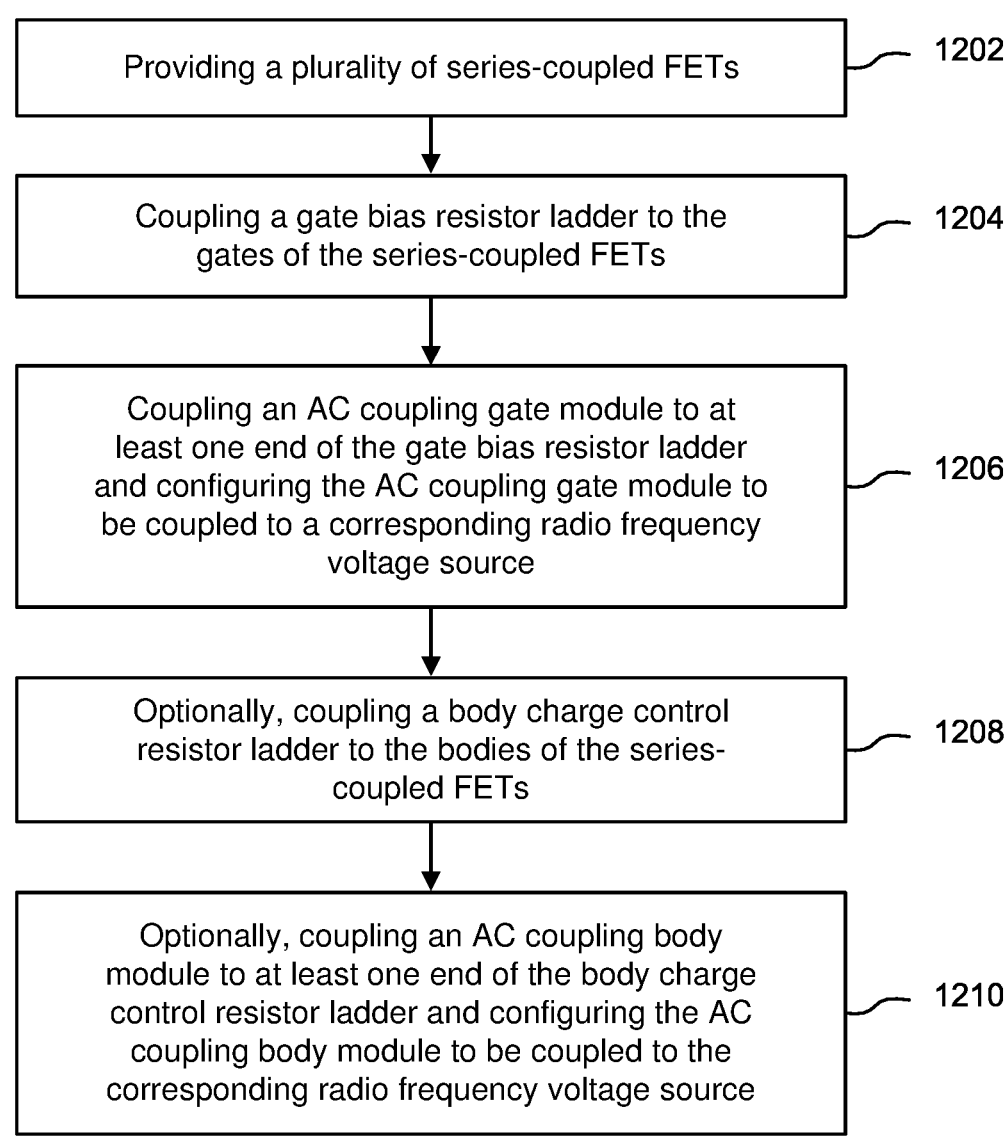

Providing a plurality of series-coupled FETs — 1202

Coupling a gate bias resistor ladder to the gates of the series-coupled FETs — 1204

Coupling an AC coupling gate module to at least one end of the gate bias resistor ladder and configuring the AC coupling gate module to be coupled to a corresponding radio frequency voltage source — 1206

Optionally, coupling a body charge control resistor ladder to the bodies of the series-coupled FETs — 1208

Optionally, coupling an AC coupling body module to at least one end of the body charge control resistor ladder and configuring the AC coupling body module to be coupled to the corresponding radio frequency voltage source — 1210

AC COUPLING MODULES FOR BIAS LADDERS

CROSS-REFERENCE TO RELATED APPLICATIONS—CLAIM OF PRIORITY

The present application is a continuation of, and claims priority to, co-pending and commonly assigned U.S. patent application Ser. No. 17/884,252, filed Aug. 9, 2022, entitled "AC Coupling Modules for Bias Ladders", issued on Jan. 9, 2024 as U.S. Pat. No. 11,870,431, the contents of which are incorporated herein by reference. Application Ser. No. 17/884,252 is a continuation of, and claims priority to commonly assigned U.S. patent application Ser. No. 17/325, 867, filed May 20, 2021, entitled "AC Coupling Modules for Bias Ladders", issued on Aug. 16, 2022 as U.S. Pat. No. 11,418,183, the contents of which are incorporated herein by reference. Application Ser. No. 17/325,867 is a continuation of, and claims priority to, commonly assigned U.S. patent application Ser. No. 16/852,804, filed Apr. 20, 2020, entitled "AC Coupling Modules for Bias Ladders", issued on May 25, 2021 as U.S. Pat. No. 11,018,662, the contents of which are incorporated herein by reference. Application Ser. No. 16/852,804 is a continuation of, and claims priority to, commonly assigned U.S. patent application Ser. No. 16/261, 167, filed Jan. 29, 2019, entitled "AC Coupling Modules for Bias Ladders", now U.S. Pat. No. 10,630,280 issued Apr. 21, 2020, the contents of which are incorporated herein by reference. Application Ser. No. 16/261,167 is a continuation of, and claims priority to, commonly assigned U.S. patent application Ser. No. 15/939,144, filed Mar. 28, 2018, entitled "AC Coupling Modules for Bias Ladders", now U.S. Pat. No. 10,236,872, issued Mar. 19, 2019, the contents of which are incorporated herein by reference.

The present application may be related to the following patents and patent applications, the contents of all of which are incorporated herein by reference:

U.S. Pat. No. 8,669,804, issued on Mar. 11, 2014 and entitled "*Device and Methods for Improving Voltage Handling and/or Bi-directionality of Stacks of Elements when Connected Between Terminals*";

U.S. patent application Ser. No. 15/256,453, filed Sep. 2, 2016 and entitled "*Positive Logic Digitally Tunable Capacitor*", now U.S. Pat. No. 9,948,281 issued Apr. 17, 2018;

U.S. patent application Ser. No. 15/289,768, filed Oct. 10, 2016, entitled "*Reduced Dissipation Switch FET Gate Biasing*", now abandoned, which claims priority to U.S. Provisional Application No. 62/241,498, filed Oct. 14, 2015;

U.S. patent application Ser. No. 15/939,128, filed on Mar. 28, 2018, entitled "*Positive Logic Switch with Selectable DC Blocking Circuit*", now U.S. Pat. No. 10,505, 530, issued Dec. 10, 2019;

U.S. patent application Ser. No. 15/939,132, filed on Mar. 28, 2018, entitled "*Stacked FET Switch Bias Ladders*", now U.S. Pat. No. 10,886,911, issued Jan. 5, 2021.

BACKGROUND

(1) Technical Field

The invention relates to electronic circuits, and more particularly to radio frequency electronic switch circuits and related methods.

(2) Background

In radio frequency (RF) systems, such as cellular phones and WiFi networks, electronic switch circuits are often used in series with RF signal lines to selectively block or conduct RF signals, such as between an antenna and a transceiver circuit. Electronic switch circuits are also often used in a shunt configuration between an RF signal line and a reference potential (e.g., circuit ground), for example, to selectively isolate nodes of the RF signal line from significantly influencing other circuitry. As one example, FIG. 1 is a simplified schematic circuit of a common prior art series-shunt switch circuit configuration 100. In the illustrated configuration, a series switch circuit 102 is coupled in series with an RF signal line 104 between an $RF_{IN}$ port and an $RF_{OUT}$ port, and a shunt switch circuit 106 is coupled to the RF signal line 104 between the $RF_{OUT}$ port and circuit ground. As illustrated, the series switch circuit 102 and shunt switch circuit 104 are modeled as single-pole, single-throw (SPST) switches. In use, the series switch circuit 102 and shunt switch circuit 106 are generally operated in a complementary manner: if series switch circuit 102 is open, then shunt switch circuit 106 is closed, and if series switch circuit 102 is closed, then shunt switch circuit 106 is open.

Ideally, switch circuits such as those shown in FIG. 1 should not appreciably alter or affect an RF signal. However, in integrated circuits, RF switching circuits are generally implemented with transistors, particularly field-effect transistors (FETs), and more particularly MOSFETs. A FET in a conducting (ON) state presents some resistance, $R_{ON}$, to a conducted signal, and in a blocking (OFF) state presents some capacitance, $C_{OFF}$, which may be in series, shunt, or parallel to an RF signal line. Accordingly, FET-based switch circuits generally behave less than ideally in an RF circuit.

A further issue with FETs is that the voltage that a single FET can withstand between drain and source without breaking down is generally limited to a few volts. In an electronic system, there may be parts of the system where the voltage that must be withstood far exceeds the voltage handling capability of a single FET. A common solution is to series stack FETs so that the drain-source voltage across any one FET is less than its drain-source breakdown voltage.

For example, FIG. 2 is a schematic circuit of a prior art series-shunt RF switch circuit 200 using FET stacks. In this example, an RF signal from an antenna ANT is coupled from $RF_{IN}$ through a series stack 202 to $RF_{OUT}$. A shunt stack 204 is coupled between $RF_{OUT}$ and circuit ground. Each of the stacks 202, 204 comprises a plurality of series-coupled FETs M1-Mn (although "n" may differ for the two stacks 202, 204). In this example, each FET includes a dedicated gate resistor Rg.

A standard biasing scheme is usually used in this type of circuit 200 when configured with FET switches having a common threshold voltage and channel structure. A positive voltage is applied to the gate of each FET M1-Mn of a stack 202, 204 to turn the stack ON (conducting), and a negative voltage is applied to the gate of each FET M1-Mn of a stack 202, 204 to turn the stack OFF (blocking). By way of example, a positive DC voltage of +3 volts may be applied (through the resistors Rg) to the gates of each FET M1-Mn of a stack 202, 204 to turn the stack ON, and a negative DC voltage of −3 volts may be applied (again through the resistors Rg) to the gates of each M1-Mn of a stack 202, 204 to turn the stack OFF. For good performance, it is desirable to use a large enough negative voltage to fully turn each FET switch M1-Mn OFF. Turning the FET switches into a full OFF state results in improved RF linearity in terms of harmonics and inter-modulation distortion (IMD), better RF power handling, higher isolation, and lower leakage current, among other advantages.

In most applications using an integrated circuit (IC) implementation of the circuit shown in FIG. 2, a positive supply voltage is readily available from an external source. A negative supply voltage is usually generated on-chip using a bias generator 206, shown in FIG. 2 as coupled to the gate resistors Rg. The bias generator 206 may conventionally use one or more negative voltage charge pumps and voltage regulators that convert an externally supplied positive supply voltage to a negative voltage.

The configuration shown in FIG. 2 works reasonably well for many applications. However, there are applications where generating a negative supply voltage is either not desired or not practical due to design constraints; in some applications, use of a negative charge pump is not even possible. These are generally applications with stringent requirements such as extremely low current and power consumption, extremely low noise sensitivity, and/or very small IC die areas. Moreover, in biasing schemes wherein charge pumps are used to generate negative supply power, switching speed is limited by the current sourcing capability of the charge pumps. Further, the voltage swing on the FET gates from full ON to full OFF is significant—from +3V to −3V in the example above, or a 6V swing, which further limits switching speed. In addition, the charge swing has to go through the series gate resistors of the FETs, which dampens and slows the switching process.

Solutions to utilizing a FET switch stack without using a negative supply voltage are taught in co-pending U.S. patent application Ser. No. 15/256,453, filed Sep. 2, 2016 and entitled "*Positive Logic Digitally Tunable Capacitor*". FIG. 3 is a schematic circuit of a series-shunt RF switch circuit 300 using "positive logic" FET stacks. In accordance with one embodiment of the referenced patent application, an RF signal from an antenna ANT is coupled from $RF_{IN}$ through a series stack 302 to $RF_{OUT}$. A shunt stack 304 is coupled between $RF_{OUT}$ and circuit ground. Each of the stacks 302, 304 comprise a plurality of series-coupled FETs M1-Mn (although "n" may differ for the two stacks 302, 304) which have the characteristic that each FET turns OFF sufficiently when Vgs≈0V. In this example, each FET includes a dedicated gate resistor Rg. Each stack 302, 304 also includes two bracketing DC blocking capacitors C connected in series with the FETs M1-Mn; the blocking capacitors C may each have different values for particular applications.

Each of the stacks 302, 304 is configured to be coupled to two non-negative supply voltages, Vgate and Vdrain, which are used to control the switch state, ON or OFF, of associated FETs M1-Mn. The Vgate supply voltage is coupled to the gates of the FETs M1-Mn of each stack 302, 304 through corresponding parallel gate resistors Rg. The Vdrain supply voltage is coupled to a network of parallel resistors Rds that are coupled as shown to respective drains or sources of each of the FETs M1-Mn, including shared drains-source nodes between the FETs M1-Mn.

In the illustrated example, the FETs M1-Mn are turned ON by applying a positive Vgate voltage (e.g., +3V) to the FET gates through their respective gate resistors Rg, while applying a Vdrain voltage of 0V to the FET drains and sources through respective Rds resistors. This configuration effectively creates a positive DC gate-source voltage, $V_{GS}$, for every FET M1-Mn (i.e., $V_{GS}$=+3V with respect to the source voltage of 0V if Vgate=+3V). The FET stacks are turned OFF by applying a Vgate voltage of 0V to the FET gates through their respective gate resistors Rg, while applying a positive Vdrain voltage (e.g., +3V) to the FET drains and sources through respective Rds resistors. This effectively creates, in relative terms, a negative $V_{GS}$ for every FET M1-Mn (i.e., $V_{GS}$=−3V with respect to the source voltage of +3V if Vgate=0V).

Obtaining a negative $V_{GS}$ for the OFF state is accomplished by virtue of the DC blocking capacitors C on both ends of each stack 302, 304 to achieve the required gate-source voltage levels in both the ON and OFF states. Without the blocking capacitors C, the "end" FETs (i.e., M1, Mn) would have either a drain or source DC coupled to some potential (e.g., circuit ground) that would not allow the required $V_{GS}$ voltage to be applied to the FETs M1-Mn. With the DC blocking capacitors C, when a positive Vdrain voltage is applied, a positive voltage can be built up on the drain and source nodes of the FETs M1-Mn as the capacitors C charge. Other variations and modes of operation are also disclosed in U.S. patent application Ser. No. 15/256,453.

Circuits of the type shown in FIG. 3 avoid use of a negative voltage and thus require no negative voltage charge pump. Switching speed is increased because discharge of the FET gates does not have to go through a charge pump. Accordingly, operation without a charge-pump enables a zero current standby mode, with very fast switching and settling times and a valid RF state in standby mode, as well as other advantages as disclosed in the U.S. patent application Ser. No. 15/256,453. However, there is room for improvement.

In particular, the DC blocking capacitors C have to be large for high isolation and for low insertion loss and low mismatch loss (i.e., their impedance at a desired operating frequency needs to be low), thus consuming IC die area and increasing cost. The constant presence of the DC blocking capacitors C in both ON and OFF states for a series stack 302 affects a conveyed RF signal, while their constant presence and size impacts isolation. Further, the constantly present DC blocking capacitors C have to be charged through the Rds resistor network, which impacts switching and settling times (this is in addition to the usual Rg*Cgs time constant on the gate terminal side). Moreover, the DC blocking capacitors C are generally formed as metal-insulator-metal (MIM) capacitor structures, which are sensitive to electro-static discharge (ESD) and thus require ESD protection on RF ports (e.g., $RF_{IN}$).

In addition, in practical applications, a series stack 302 generally requires an integrated shunt tuning inductor L coupled near each DC blocking capacitor C to perform both impedance matching (i.e., resonating out the capacitance of the DC blocking capacitors C) and ESD protection for port connections (by providing a DC path to a reference potential). Such added shunt tuning inductors L, in combination with the adjacent blocking capacitors C, cause the series stack 302 to have a high-pass filter response, affecting the RF performance of the switch. The shunt tuning inductors L also consume IC area, thus increasing cost.

A further area for improvement is in handling high voltage. Embodiments of the type shown in FIG. 3 may breakdown when subjected to a high voltage RF signal due to RF voltages being coupled through to gate resistors, causing breakdown.

Accordingly, there is a need for an improved FET switch stack that does not require a negative bias voltage, but which also avoids or mitigates the drawbacks of positive logic FET stacks as described above, and which can withstand, in some embodiments, application of a high voltage RF signal. The present invention addresses these and other needs.

SUMMARY

The invention encompasses an improved positive-logic FET switch stack that does not require a negative bias voltage, exhibits high isolation and low insertion loss and mismatch loss characteristics, requires less integrated circuit (IC) area, and in some embodiments, can withstand application of a high voltage RF signal.

Embodiments include a FET stack comprising one or more series-coupled positive-logic FETs M1-Mn (i.e., zero-Vt, low-Vt, or high-Vt FETs of a type that require a negative $V_{GS}$ to turn OFF but configured so as to not require a negative power supply), series-coupled on at least one end to an "end-cap" FET $M_0$, where "$M_0$" designates a FET of a high-Vt type that turns OFF when the $V_{GS}$ of such FET is essentially zero volts. The end-cap $M_0$ FETs selectably provide either a capacitive DC blocking function or a resistive signal path. Some embodiments may comprise a stack of only $M_0$ FETs, or a mix of positive-logic FETs and $M_0$ FETs, so long as at least one end-cap FET is an $M_0$ FET. Optional end-cap capacitors may be included to prevent early breakdown of corresponding end-cap $M_0$ FETs.

Some embodiments are configured to withstand high applied RF voltages by including a series-connected bias resistor ladder for the gates of the FETs in the stack (i.e., M1-Mn, $M_0$), a series-connected Rds drain-source resistor ladder, and either a series-connected or a parallel-connected Rb body charge control resistor ladder. Some embodiments may use series-connected Rb body charge control resistor ladder in conjunction with a parallel-connected bias resistor ladder for the gates. Some embodiments may use a series-connected bias resistor ladder (in a "rail" configuration) in conjunction with a parallel-connected bias resistor ladder (in a "rung" configuration) for the gates.

Some embodiments are configured with one or more AC coupling modules each coupled to at least one end of a corresponding gate bias resistor ladder and/or body charge control resistor ladder, and configured to be coupled to a radio frequency voltage source.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 5B is a simplified schematic circuit of the FET stack of FIG. 4 showing example drain and source voltages for the interior FETs Mn and end-cap FETs $M_0$ when in an ON state.

FIG. 5C is a simplified schematic circuit of the FET stack of FIG. 4 showing example drain and source voltages for the interior FETs Mn and end-cap FETs $M_0$ when in an OFF state.

FIG. 10 is a process flow diagram showing one method for providing a series-shunt switch circuit.

FIG. 11 is a process flow diagram showing one method for biasing a FET switch stack.

FIG. 12 is a process flow diagram showing a method for providing a FET switch stack.

Like reference numbers and designations in the various drawings indicate like elements.

DETAILED DESCRIPTION

The invention encompasses an improved positive-logic FET switch stack that does not require a negative bias voltage, exhibits high isolation and low insertion loss and mismatch loss characteristics, requires less integrated circuit (IC) area, and in some embodiments, can withstand application of a high voltage RF signal.

Embodiments include a FET stack comprising one or more series-coupled positive-logic FETs M1-Mn (i.e., zero-Vt, low-Vt, or high-Vt FETs of a type that require a negative $V_{GS}$ to turn OFF but configured so as to not require a negative power supply), series-coupled on at least one end to an "end-cap" FET $M_0$, where "$M_0$" designates a FET of a high-Vt type that turns OFF when the $V_{GS}$ of such FET is essentially zero volts. The end-cap $M_0$ FETs selectably provide either a capacitive DC blocking function or a resistive signal path. Some embodiments may comprise a stack of only $M_0$ FETs, or a mix of positive-logic FETs and $M_0$ FETs, so long as at least one end-cap FET is an $M_0$ FET. Optional end-cap capacitors may be included to prevent early breakdown of corresponding end-cap $M_0$ FETs.

Some embodiments are configured to withstand high applied RF voltages by including a series-connected bias resistor ladder for the gates of the FETs in the stack (i.e., M1-Mn, $M_0$), a series-connected Rds drain-source resistor ladder, and either a series-connected or a parallel-connected Rb body charge control resistor ladder. Some embodiments may use series-connected Rb body charge control resistor ladder in conjunction with a parallel-connected bias resistor ladder for the gates. Some embodiments may use a series-connected bias resistor ladder (in a "rail" configuration) in conjunction with a parallel-connected bias resistor ladder (in a "rung" configuration) for the gates.

Some embodiments are configured with one or more AC coupling modules each coupled to at least one end of a corresponding gate bias resistor ladder and/or body charge control resistor ladder, and configured to be coupled to a radio frequency voltage source.

Embodiments of the invention may be used in any circuit configuration in which a FET stack may be necessary or useful, such as RF switch circuits and digitally tuned capacitors (for example, of the type taught in U.S. patent application Ser. No. 15/256,453).

Selectable DC Blocking Embodiments

Figure 4:
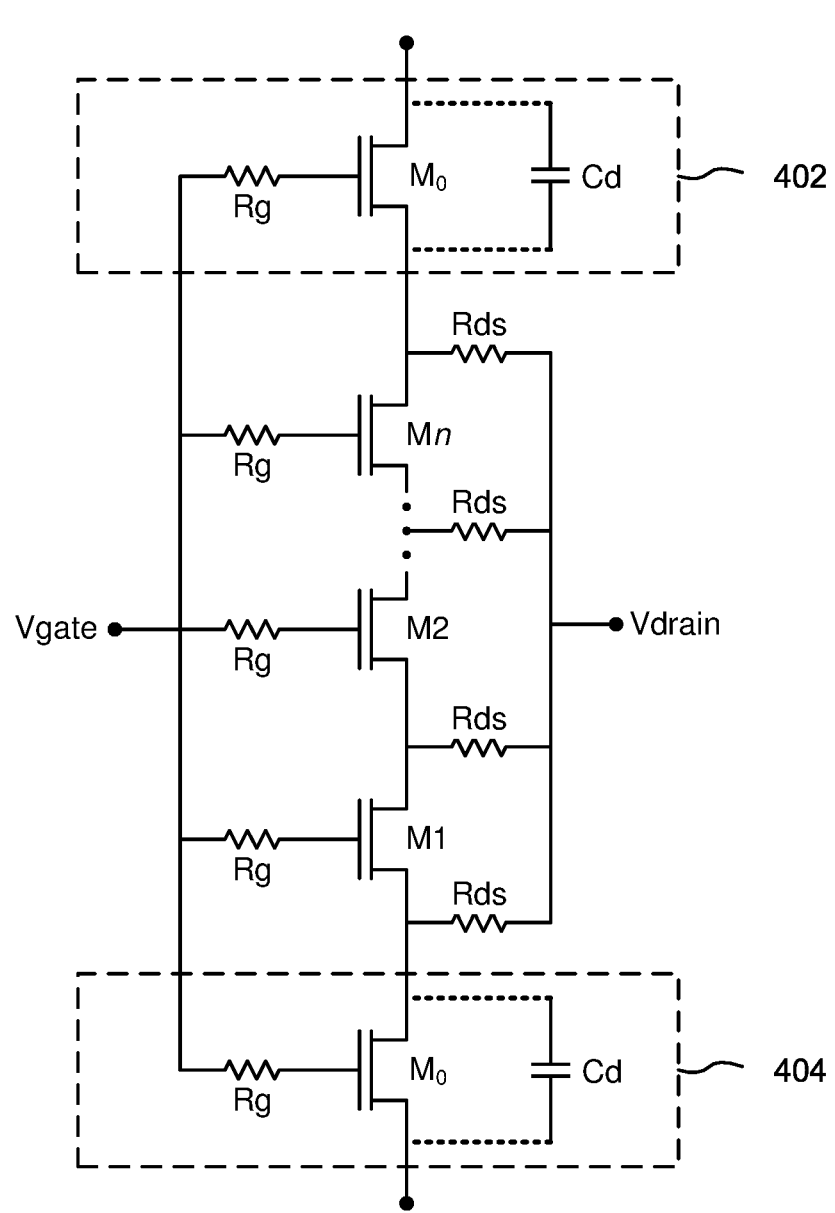
FIG. 4 is a schematic circuit of an improved positive logic FET stack.

FIG. 4 is a schematic circuit of an improved positive logic FET stack 400. The stack 400 comprises one or more series-coupled FETs M1-Mn. Each of the FETs M1-Mn are of a type that require a negative $V_{GS}$ to turn OFF (e.g., −3V) but which are configured to not require a negative power supply, as taught in co-pending U.S. patent application Ser. No. 15/256,453. Examples of such FETs M1-Mn may have a $V_T \approx 0V$ and a low $R_{ON}$ (e.g., much less than $Z_0$ ohms, where $Z_0$ is the system characteristic impedance).

In some embodiments, the FETs M1-Mn in the "interior" of the stack 400, which may be zero-Vt, low-Vt, or high-Vt FETs, are bracketed by "end-cap" $M_0$ high-Vt FETs. In other embodiments, only one end of one or more series-coupled positive-logic FETs M1-Mn is series coupled to an $M_0$ FET; thus, for example, the end-cap $M_0$ FET in dashed box 402 or the end-cap $M_0$ FET in dashed box 404 may be omitted in some applications. Zero-Vt, low-Vt and high-Vt FETs are available from a number of different IC commercial foundries. Examples of such end-cap $M_0$ FETs may have a $V_T \approx 0.7V$, and may have a higher $R_{ON}$ than the FETs M1-Mn.

Each FET M1-Mn, $M_0$ includes an associated gate resistor Rg; in the illustrated example, the gate resistors Rg are dedicated to each FET and parallel to each other (for other configurations, see below).

Two non-negative supply voltages, Vgate and Vdrain, are used to control the switch state, ON or OFF, of associated FETs M1-Mn, $M_0$. The Vgate supply voltage is coupled to the gates of the FETs of the stack 400 through corresponding dedicated parallel gate resistors Rg. The Vdrain supply voltage is coupled to a network of parallel resistors Rds that are coupled as shown to respective sources or drains of each of the FETs M1-Mn, including shared drains-source nodes between the FETs M1-Mn. In the embodiment of FIG. 4, the gate resistors Rg and the network resistors Rds may be of equal size, but a person skilled in the art will understand that other embodiments may include resistors of different sizes.

In the embodiment shown in FIG. 4, the drain and source of each end-cap $M_0$ FET is coupled in parallel with a capacitor Cd. As disclosed in greater detail below, since the end-cap $M_0$ FETs are biased with Vgs=0V and thus usually cannot handle the full drain-source voltage Vds applied across them, the Vds across each end-cap $M_0$ FET is lowered (e.g., to 2V) by their respective capacitor Cd.

Figure 5A:
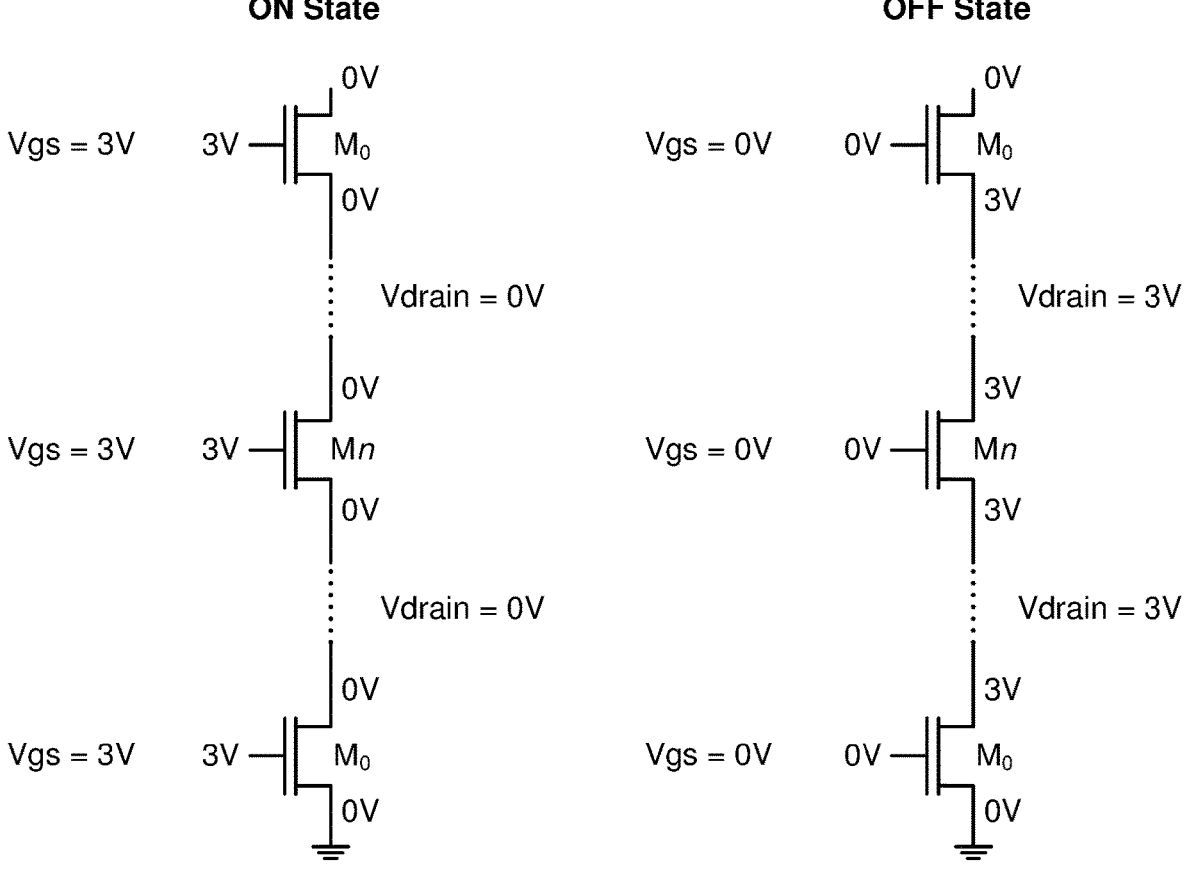
FIG. 5A is a table showing example voltages for Vgate and Vdrain corresponding to ON and OFF states for the FET stack of FIG. 4.

FIG. 5A is a table showing example voltages for Vgate and Vdrain corresponding to ON and OFF states for the FET stack of FIG. 4. FIG. 5B is a simplified schematic circuit of the FET stack of FIG. 4 showing example drain and source voltages for the interior FETs Mn and end-cap $M_0$ FETs when in an ON state. FIG. 5C is a simplified schematic circuit of the FET stack of FIG. 4 showing example drain and source voltages for the interior FETs Mn and end-cap $M_0$ FETs when in an OFF state.

In the example illustrated in FIGS. 4 and 5B, the FETs FET M1-Mn, $M_0$ are turned ON by applying a positive Vgate voltage (e.g., +3V) to the FET gates through their respective gate resistors Rg, while applying a Vdrain voltage of 0V to the drains and sources of FETs M1-Mn through respective Rds resistors. (Note that, technically, the source for the "top" $M_0$ FET would be, for example, a coupled antenna or other RF signal source, and thus its drain is at the "bottom" end of that FET. Similarly, the source for the "bottom" $M_0$ FET would be, for example, circuit ground, and thus its drain is at the "top" end of that FET. Accordingly, the Vdrain voltage is coupled to the respective drains of both the "top" $M_0$ FET and the "bottom" $M_0$ FET. As should be clear, "top" and "bottom" are with respect to the illustrated orientation of the FET stack in FIG. 4 and are for convenience only). This configuration effectively creates a positive DC gate-source voltage, $V_{GS}$, for every FET M1-Mn, $M_0$ (i.e., $V_{GS}$=+3V with respect to the source voltage of 0V if Vgate=+3V), as shown in FIG. 5B. In the ON state, the end-cap $M_0$ FETs each present a series resistance of $R_{ON}$. Since the ON-state end-cap $M_0$ FETs essentially present no series capacitance, shunt tuning inductors L for impedance matching may be omitted, thus improving broadband performance and reducing consumption of IC area.

In the example illustrated in FIGS. 4 and 5C, the FETs FET M1-Mn, $M_0$ are turned OFF by applying a Vgate voltage of 0V to the FET gates through their respective gate resistors Rg, while applying a positive Vdrain voltage (e.g., +3V) to the drains and sources of FETs M1-Mn (and thus to the source of the "top" $M_0$ FET, and to the drain of the "bottom" $M_0$ FET) through respective Rds resistors. This effectively creates a negative $V_{GS}$ for every FET M1-Mn (i.e., $V_{GS}$=−3V with respect to the source voltage of +3V if Vgate=0V), as shown in FIG. 5C. The end-cap $M_0$ FETs have either a $V_{GS}$ of −3V (for the "top" $M_0$ FET) or 0V (for the "bottom" $M_0$ FET), either of which is sufficient to turn the end-cap $M_0$ FETs OFF in light of their $V_{GS}$ characteristics (although the current blocking capability of the end-cap $M_0$ FETs increases as $V_{GS}$ becomes more negative). In the OFF state, the end-cap $M_0$ FETs each present a series capacitance of $C_{OFF}$, and thus perform a DC blocking function.

As an alternative embodiment, when the "bottom" $M_0$ FET is ON, the terminal labeled Vdrain in FIG. 4 can be left as an open circuit, since all of the FETs coupled to the Rds resistor network would be coupled to circuit ground through the "bottom" $M_0$ FET. For the OFF state, the terminal labeled Vdrain in FIG. 4 would be coupled to a suitable voltage (e.g., +3V).

In the example embodiment of FIG. 4, Vdrain is varied between 0V to 3V as a function of the ON or OFF state of the FET stack 400. In other embodiments, Vdrain may be set as a fixed voltage, such as a constant mid-rail voltage (e.g., +1.5V). Thus, similar to the example shown in FIG. 5A-5C, when Vgate is high (e.g., +3V), a positive voltage of +1.5V will appear across the gate-source of each FET M1-Mn, $M_0$ and turn those FETs ON. Conversely, when Vgate is low (e.g., 0V), a negative voltage of −1.5V will appear across the gate-source of each interior FET M1-Mn and turn those FETs OFF; similarly, $V_{GS}$ for the "top" end-cap $M_0$ FET will be −1.5V, while the $V_{GS}$ for the "bottom" end-cap $M_0$ FET will be 0V, and thus both of the end-cap $M_0$ FETs will be OFF. In a constant Vdrain biasing scheme, lower or higher voltages (e.g., +0.5V) may also be used for Vdrain. In a further embodiment, the fixed mid-rail voltage may be chosen based on the threshold voltage, $V_T$, of the FETs to provide a beneficial (potentially optimal) level of gate overdrive ($V_{GS}$-$V_T$) to balance performance parameters in both ON and OFF states. More generally, the voltages for Vgate and Vdrain can be selected (and potentially optimized) to provide a balanced amount of gate overdrive. If Vdrain is biased to a non-zero DC voltage, a correctly sized shunt capacitor (or RC filter) may need to be added to sufficiently filter out RF voltage swings.

Figure 3:
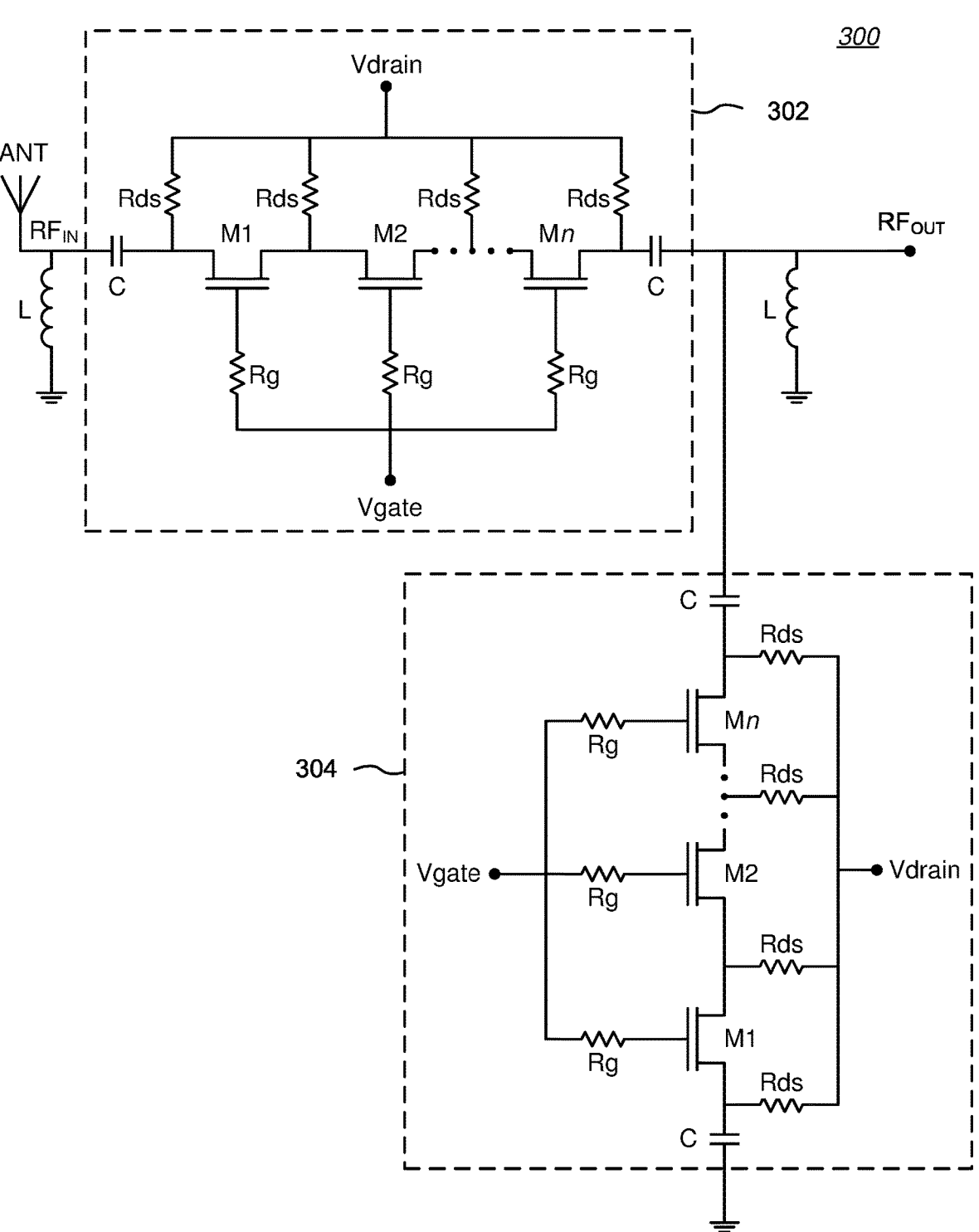
FIG. 3 is a schematic circuit of a series-shunt RF switch circuit using "positive logic" FET stacks.

The circuit configuration of the FET stack 400 of FIG. 4 is thus similar to the circuit configurations of the stacks 302, 304 of FIG. 3, except that the end-cap $M_0$ FETs are used for DC blocking instead of explicit DC blocking capacitors C. In operation, the end-cap $M_0$ FETs can be turned to an OFF state in which they function as DC blocking capacitors having a capacitance of $C_{OFF}$. Importantly, the end-cap $M_0$ FETs also can be turned to an ON state that forms an actual resistive DC path rather than a capacitance, resulting in little or no insertion loss, mismatch loss, or frequency dependence penalty compared to constantly present DC blocking capacitors C, and also decreasing switching and settling times. While the $R_{ON}$ for the end-cap $M_0$ FETs generally may be greater than the $R_{ON}$ for the interior FETs M1-Mn, with larger numbers of interior FETs M1-Mn (i.e., higher stack heights), the $R_{ON}$ of the interior FETs M1-Mn will dominate the series resistance.

A further benefit of using one or more end-cap $M_0$ FETs as DC blocking capacitances is that they provide automatic ESD protection, because the FET stack is self-protected by drain-to-source breakdown and there are no additional series components between the FET drain-source terminals and the external ports (ESD pulses are applied across external ports). Accordingly, shunt tuning inductors L for ESD protection of MIM capacitors in FET stacks coupled to ports may be omitted, thus reducing consumption of IC area. In addition, using one or more end-cap $M_0$ FETs provides a reasonable "un-powered OFF" state for applications that benefit from some isolation when the system voltage supply, $V_{CC}$, equals 0V.

In some embodiments, all of the FETs in a stack 400 may be of the $M_0$ type. In other embodiments, some (but not all) of the interior FETs in a stack 400 may be of the $M_0$ type, so long as at least one end-cap $M_0$ FET is provided. For example, the stack 400 may comprise a mix of FETs in a sequence such as $M_0$-M1-$M_0$-M2-$M_0$, where M1 and M2 are positive-logic FETS. Such mixed configurations may have a higher series resistance than the embodiment shown in FIG. 4, due to higher $R_{ON}$ for the $M_0$ FETs, but would have a lower $R_{ON}$ than a stack comprising all $M_0$-type FETs. Mixed configurations of FET types and sequences can be used to help optimize the total stack performance parameters of $R_{ON}$, OFF isolation, peak voltage (Vpk) handling, DC operation, and un-powered circuit behavior.

Referring back to FIG. 4, optional capacitors Cd may be coupled in parallel with the end-cap $M_0$ FETs, from drain to source, as indicated by the dotted connector lines. When the end-cap $M_0$ FETs are in an ON state, the optional capacitors Cd are effectively bypassed and thus functionally out of the RF signal path. When the end-cap $M_0$ FETs are in an OFF state, the optional capacitors Cd are coupled to the RF signal path in parallel with the end-cap $M_0$ FETs (which each present as a capacitance of $C_{OFF}$). One advantage of the optional capacitors Cd is that they reduce RF voltage swing across the end-cap $M_0$ FETs (e.g., to 2V instead of a full 3V) and thus help prevent early breakdown of those FETs. It may be desirable for the optional capacitors Cd to have a capacitance that is about 5-10 times the $C_{OFF}$ of the end-cap $M_0$ FETs. In some embodiments, only the "bottom" $M_0$ FET (i.e., nearest circuit ground in FIG. 4) includes the capacitor Cd.

With further reference to FIG. 4, the person skilled in the art will appreciate that, regardless of the switching state of the FET stack 400, and except for leakage currents, the FET stack 400 and generation of the bias voltages Vgate and Vdrain does not consume any significant DC power, unlike the case of FET stacks that require a charge pump. This is very beneficial for integrated circuits with stringent power or current consumption requirements. Embodiments may use the existing system voltage supply rail to provide Vgate and Vdrain; however, a person skilled in the art will understand that other design choices to provide Vgate and Vdrain may be envisaged.

In yet other embodiments, the gates of one or both of the end-cap $M_0$ FETs may be biased separately from the interior FETs M1-Mn. For example, biasing the gates of both end-cap $M_0$ FETs with a negative gate voltage (and thus a negative V G s) would more completely turn both FETs OFF and improve the linearity and harmonics performance of those FETs, but would not require a significant current draw since such FETs inherently draw low body current and are only two in number. Negative biasing would also allow the optional capacitors Cd to be much smaller than otherwise, or to be omitted entirely. Accordingly, a simple negative voltage generator could be used to generate a negative gate voltage bias for just the end-cap $M_0$ FETs.

Figure 6:
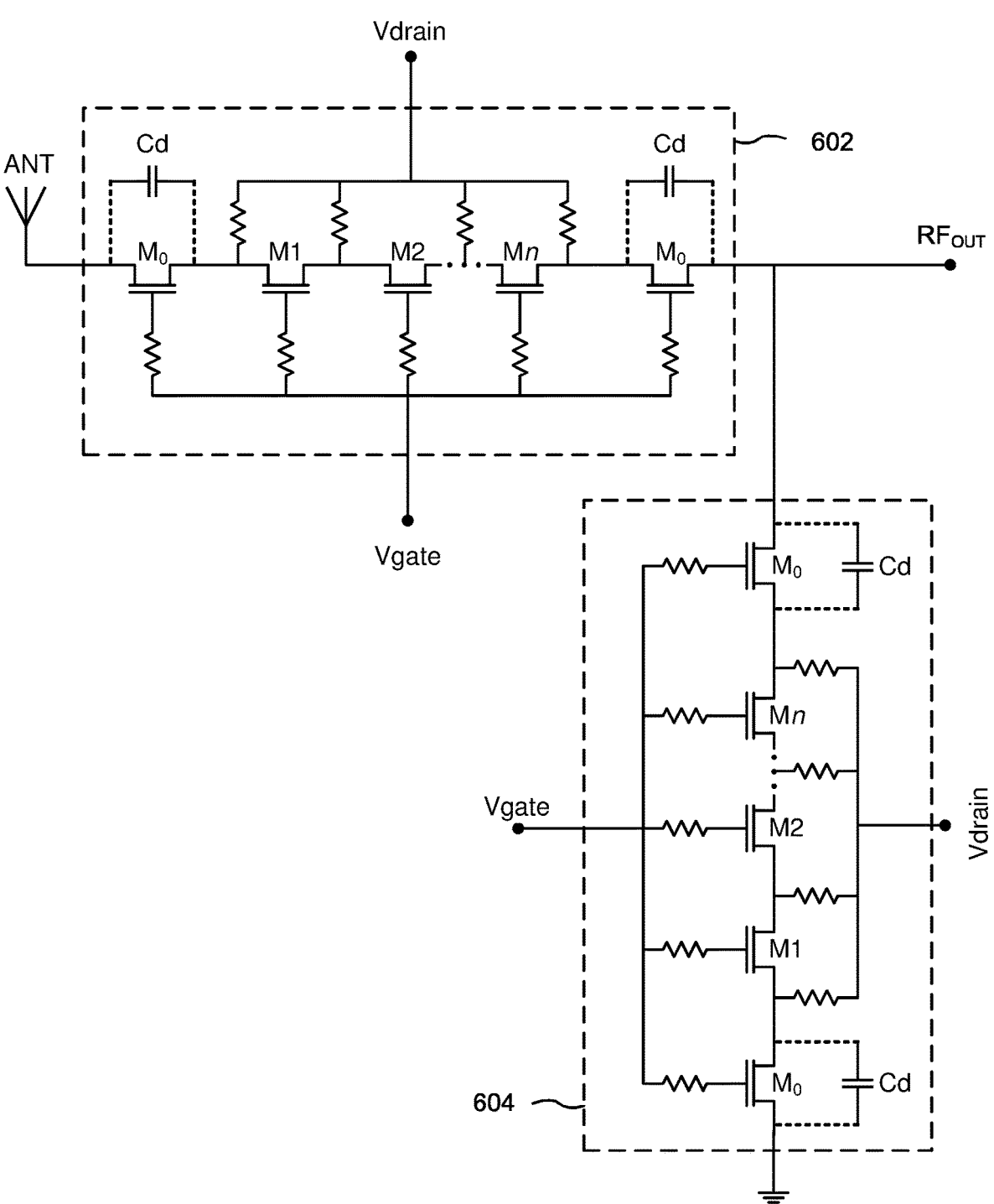
FIG. 6 is a schematic diagram of a series-shunt RF switch circuit using the improved positive logic FET stacks of FIG. 4.

FIG. 6 is a schematic diagram of a series-shunt RF switch circuit 600 using the improved positive logic FET stacks of FIG. 4. In the illustrated example, an RF signal from an antenna ANT is coupled from $RF_{IN}$ through a series stack 602 to $RF_{OUT}$. A shunt stack 604 is coupled between $RF_{OUT}$ and a reference potential (circuit ground in this case). Each of the stacks 602, 604 are similar to the FET stack 400 of FIG. 4, although "n" may differ for the two stacks 602, 604. (To avoid clutter, labels for the gate resistors Rg and the resistors Rds of the network coupled to the sources or drains of each of the FET M1-Mn, $M_0$ are omitted). As described above with respect to FIG. 4, each of the stacks 602, 604 is configured to be coupled to two non-negative supply voltages, Vgate and Vdrain. Optional capacitors Cd are shown as coupled in parallel with the end-cap $M_0$ FETs. Notably absent are constantly connected DC blocking capacitors or shunt tuning and ESD protection inductors L, as in FIG. 3.

In a variation of the series-shunt RF switch circuit 600 of FIG. 6, only one end of the series stack 602 and/or the shunt stack 604 includes an end-cap $M_0$ FET.

Stacked FET Switch Bias Ladders

In the embodiments of the invention disclosed above, Vgate is applied to each FET M1-Mn, $M_0$ through an associated gate resistor Rg in a conventional biasing scheme, which provides excellent performance in many applications, including low power RF switch circuits and many series and/or shunt circuit configurations. However, for high RF voltage applications, such as RF tuning switches, an innovative biasing scheme provides for an enhanced ability to withstand such voltages.

Figure 7:
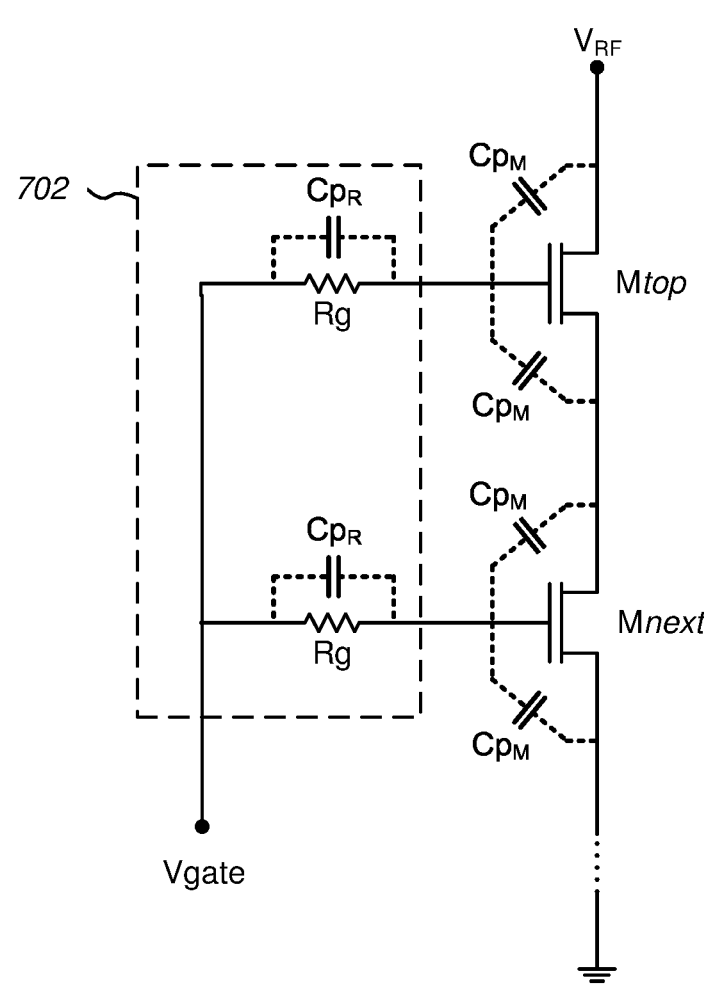
FIG. 7 depicts a schematic equivalent circuit of a portion of a prior art FET stack, showing parasitic capacitances.

To better understand the problem posed by application of high RF voltages to a FET stack, FIG. 7 depicts a schematic equivalent circuit of a portion of a prior art FET stack 700, showing parasitic capacitances. The "top" FET, Mtop, of the FET stack 700 is coupled to an RF input voltage $V_{RF}$, and to a next sequential FET, Mnext. As should be appreciated, additional FETs may be similarly sequentially coupled to Mnext.

A conventional parallel gate bias resistor ladder 702 is shown in which a variable DC gate bias voltage Vgate is coupled to the gate of each FET Mtop, Mnext through a corresponding gate resistor Rg. Because the FETs and gate resistors are integrated devices formed on an IC substrate, there are inherent associated parasitic capacitances. In particular, each gate resistor Rg has a parallel parasitic capacitance $Cp_R$, and each FET includes parasitic capacitances $Cp_M$ between its gate and drain and between its gate and source. Accordingly, the gates of each FET are imperfectly isolated from the gate and source with respect to RF signals.

Using the example of FIG. 7, if $V_{RF}$ is an RF voltage of 100V and the stack 700 is in the OFF state (i.e., all FETs are biased to block drain-source current flow), and if each FET Mtop, Mnext, etc. can safely withstand 3V from drain to source (further assuming that there sufficient other FETs to drop the applied RF voltage such that no one FET is subjected to more than 3V), then the source voltage for Mtop (and thus the drain voltage for Mnext) would be 97V, and the source voltage for Mnext would be 94V; additional FETs in the sequence would similarly drop 3V from drain to source. The parasitic capacitances $Cp_M$ will cause imposition of an RF voltage on the gate of Mtop of about 98.5V (i.e., about one-half the difference between 100V-97V); for Mnext, the imposed gate voltage would be about 95.5V. More specifically, the gate resistor Rg for Mtop will essentially have AC ground (0V) on its Vgate side, and very high RF voltage (~98.5V) on its other side. This causes excessive power dissipation in the gate resistor Rg for Mtop. The parallel parasitic capacitor $Cp_R$ across that gate resistor Rg makes the effective resistance even smaller, thereby increasing the RF power dissipation in the gate resistor Rg, which may cause device failure. A similar problem, but at increasingly lower RF voltages, occurs for each of the successive FETs Mnext in the stack 700.

Figure 8A:
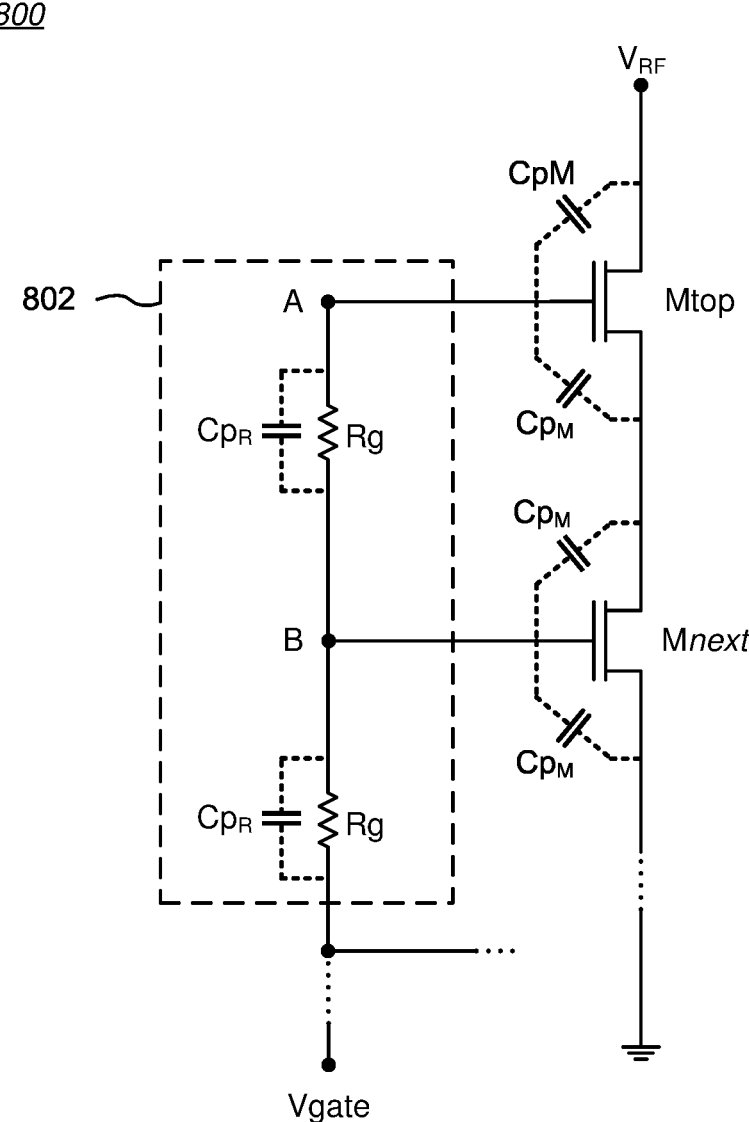
FIG. 8A is a schematic equivalent circuit of a FET stack with a series-connected resistor ladder gate bias scheme in accordance with one aspect of the present invention, showing parasitic capacitances.

FIG. 8A is a schematic equivalent circuit of a FET stack 800 with a series-connected resistor ladder gate bias scheme in accordance with one aspect of the present invention, showing parasitic capacitances. The "top" FET, Mtop, of the FET stack 800 is coupled to an RF input voltage $V_{RF}$, and to a next sequential FET, Mnext; additional FETs may be similarly sequentially coupled to Mnext. A variable DC gate bias voltage Vgate may be coupled to the gate of each FET Mtop, Mnext at nodes A, B situated after a corresponding one of a plurality of series-coupled gate resistors Rg, which thus form a series-connected gate bias resistor ladder 802. Stated another way, each gate resistor Rg is coupled to the gates of two adjacent FETs, and the series-connected gate bias resistor ladder 802 is configured to be connected to a gate bias voltage Vgate. Accordingly, in the illustrated example, for n FETs, there are n−1 gate resistors Rg (see also FIG. 8B); however, if desired, an additional gate resistor Rg can be coupled between Vgate and the gate of the "bottom" FET in the FET stack 800 (see, for example, resistor $R_{BF}$ in FIG. 8B). Each FET gate will see an applied DC bias voltage of Vgate through the series connection of the gate resistors Rg of the resistor ladder 802; that is, Vgate essentially just charges or discharges each FET gate through corresponding gate resistors Rg.

Using the example values set forth above, if $V_{RF}$ is an RF voltage of 100V and each FET Mtop, Mnext, etc. can safely withstand 3V from drain to source, then the source voltage for Mtop (and thus the drain voltage for Mnext) would be 97V, and the source voltage for Mnext would be 94V. When the stack 800 is in the OFF state, the parasitic capacitances $Cp_M$ will enable imposition of an RF voltage on the gate of Mtop of about 98.5V; for Mnext, the imposed gate voltage would be about 95.5V. Importantly, because of the changed configuration of the series-connected gate resistors Rg of the resistor ladder 802, when the stack 800 is in the OFF state, each gate resistor Rg and its corresponding parasitic capacitance $Cp_R$ will be subjected to an RF voltage of only 3V, representing the difference between the RF voltages imposed on the gates of adjacent FETs (e.g., 98.5V for the gate of Mtop, and 95.5 for the gate of Mnext). Accordingly, in these examples, while the topmost gate resistor for the FET stack 700 of FIG. 7 is subjected to an RF voltage of 98.5V across its terminals, all gate resistors of the FET stack 800 of FIG. 8 are subjected to an RF voltage of only 3V, and thus are protected from breakdown due to excessive RF voltages capacitively coupled through to the gates of associated FETs.

Figure 8B:
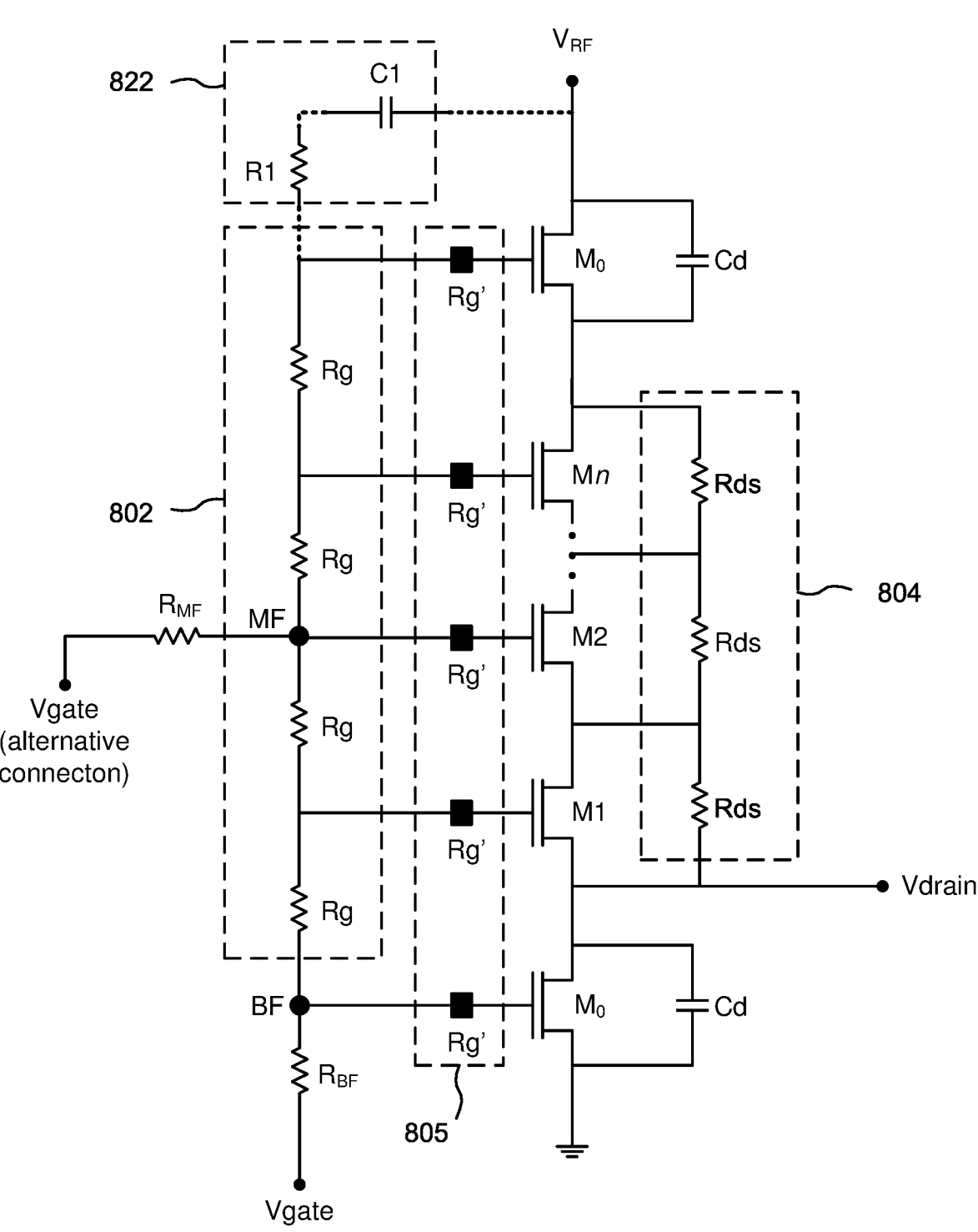
FIG. 8B is a schematic diagram of a positive logic FET stack with a series-connected gate bias resistor ladder and a series-connected drain-source resistor ladder in accordance with the present invention.

FIG. 8B is a schematic diagram of a positive logic FET stack 820 with a series-connected gate bias resistor ladder 802 and a series-connected drain-source resistor ladder in accordance with the present invention. The illustrated example is similar to the FET stack 400 of FIG. 4 (with optional capacitors Cd), but the gate resistors Rg are arrayed in a series-connected resistor ladder configuration 802 as in FIG. 8A, and, in addition, the resistors Rds of the drain-source resistor network are also arrayed as a series-connected resistor ladder 804 configured to be connected to a drain-source bias voltage Vdrain. More specifically, each resistor Rds is connected across the drain and source of a corresponding interior FET M1-Mn (but not across the end-cap $M_0$ FETs, which would defeat the DC blocking state of the end-cap $M_0$ FETs). As is the case with the series-connected gate bias resistor ladder 802, the series-connected drain-source resistor ladder 804 prevents any of the Rds resistors and FET devices from being subjected to high RF voltages $V_{RF}$. Note that DC blocking capacitors (not shown) may be coupled to Vgate and/or Vdrain as described below with respect to FIG. 8C.

In the example shown in FIG. 8B, the bias voltage Vgate is shown coupled to the "bottom" FET in the FET stack 820 at a "bottom feed" node BF through a "bottom feed" resistor $R_{BF}$ at one end of the series of resistors comprising the gate bias resistor ladder 802. However, alternative connection points may be used if desired; for example, Vgate may be coupled to the series-connected gate bias resistor ladder 802 at a "middle feed" node MF, optionally through a "middle feed" resistor $R_{MF}$. As should be clear, the "middle feed" node MF need not be in the exact middle of the gate bias resistor ladder 802, but may be anywhere between the ends of the series of resistors comprising the gate bias resistor ladder 802. A "middle feed" configuration may be useful when the FET stack 820 could experience an applied RF voltage to FET at the "top" or "bottom" (in relation to FIG. 8B) of the stack 820, as may be the case if the FET stack 820 is designed for a dual-polarity series application (i.e., an RF signal can be applied to either end of the stack) rather than a shunt configuration (see also FIG. 8F below). In particular, a "middle feed" configuration can provide a reduction in power dissipation in the gate resistors Rg regardless of whether an RF voltage amplitude is applied at either end of the transistor stack. Further benefits of a "middle feed" configuration are described in U.S. patent application Ser. No. 15/289,768 referenced above.

In an optional configuration, an additional parallel-connected gate resistor ladder 805 may be included. The parallel-connected gate resistor ladder 805 comprises respective resistors Rg' (indicated by a block symbol) coupled to the gates of the FETs in the FET stack 820. In some embodiments, a combination of a series-connected gate bias resistor ladder 802 and a parallel-connected gate resistor ladder 805 can provide reduced RF power dissipation while maintaining a low switching time constant (and therefore a high switching speed). Further benefits of a "series plus parallel" gate bias ladder configuration are described in U.S. patent application Ser. No. 15/289,768 referenced above.

Figure 8C:
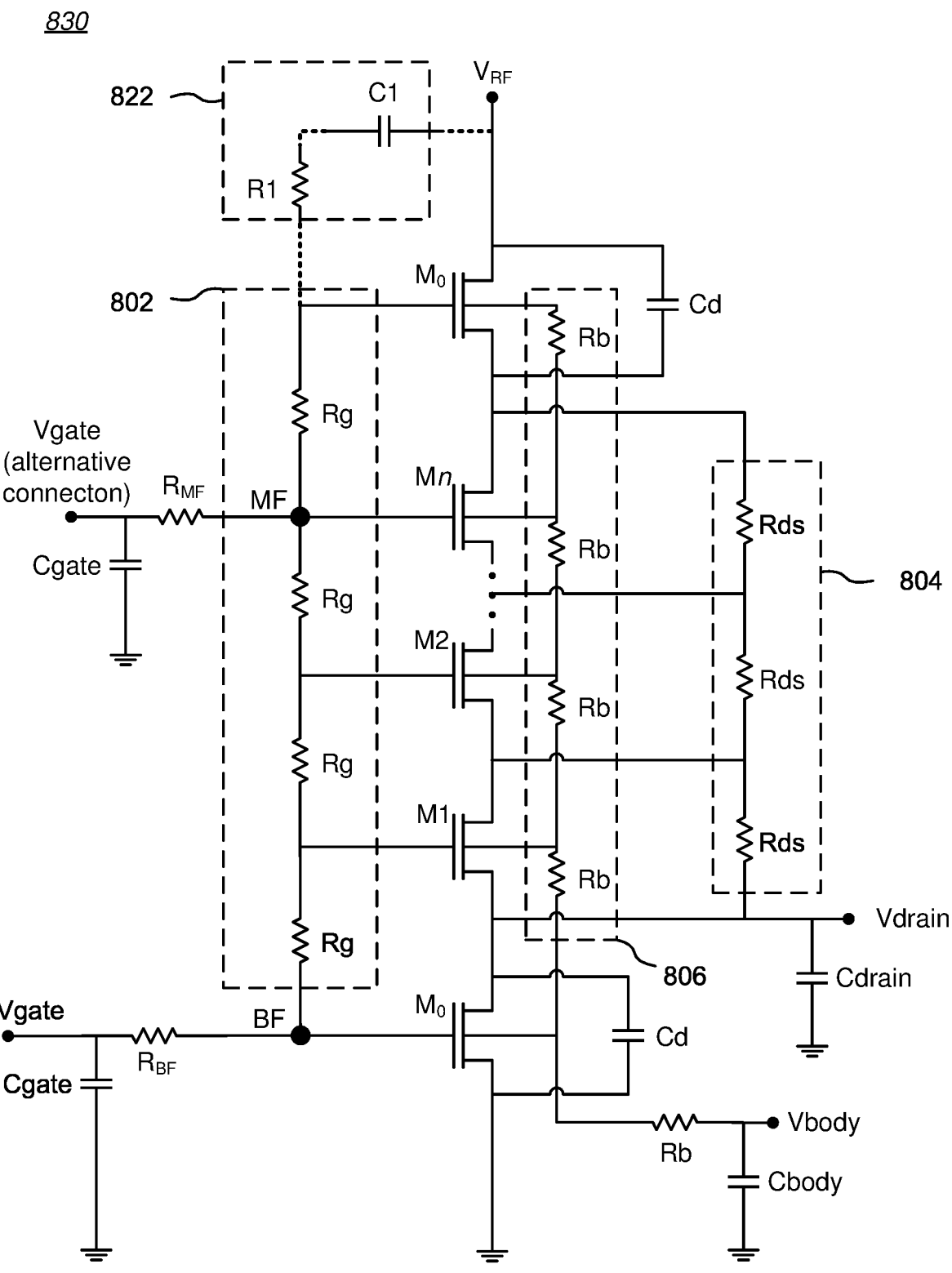
FIG. 8C is a schematic diagram of a positive logic FET stack with an added series-connected resistor ladder for controlling body charge.

FIG. 8C is a schematic diagram of a positive logic FET stack 830 with an added series-connected resistor ladder for controlling body charge, and thus "back gate" characteristics in the FETs. In this example, each FET (of any type M1-Mn, $M_0$) is treated as an explicit four-terminal transistor, and the body of each of the stacked four terminal FETs is configured to be connected to a body bias voltage Vbody directly or through a corresponding resistor Rb of a body charge control resistor ladder 806. As is the case with the series-connected gate bias resistor ladder 802 of FIG. 8B, the series-connected body charge control resistor ladder 806 prevents any of the resistors Rb from being subjected to high RF voltages $V_{RF}$. A series-connected body charge control resistor ladder 806 is also useful for FET stacks that draw a lot of body current, to mitigate or eliminate interference with gate voltages when high peak RF voltages are applied across the FET stack.

In an optional configuration, an additional parallel-connected gate resistor ladder (not shown, but essentially the same as the parallel gate resistor ladder 805 of FIG. 8C) may be included.

Figure 1:
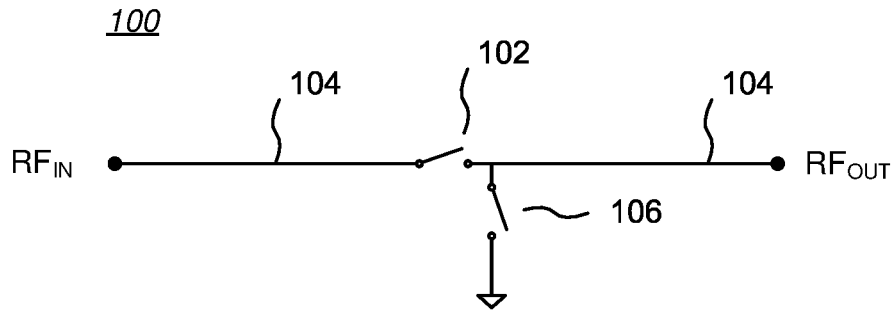
FIG. 1 is a simplified schematic circuit of a common prior art series-shunt switch circuit configuration.
Figure 2:
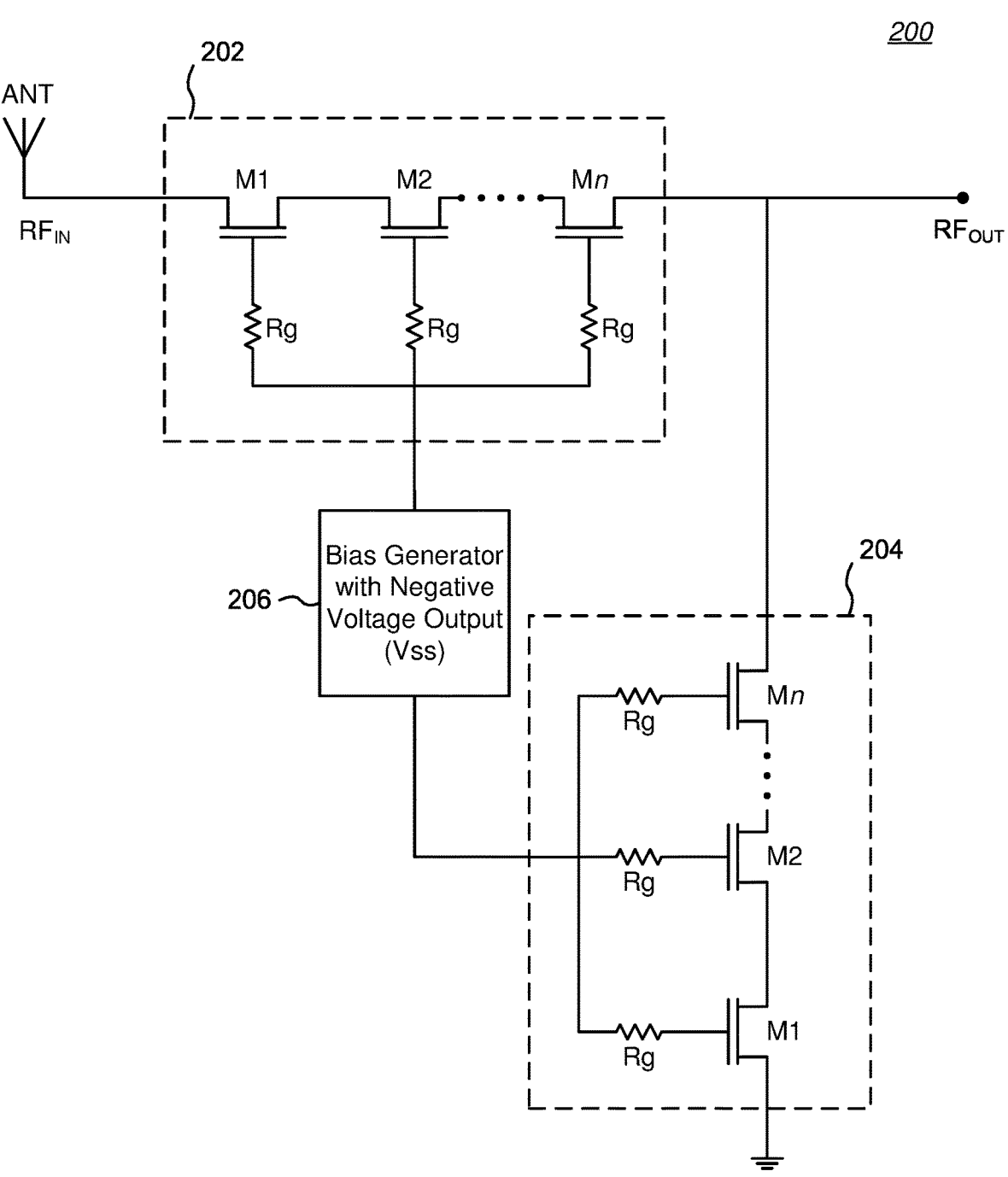
FIG. 2 is a schematic circuit of a prior art series-shunt RF switch circuit using FET stacks.

In the circuit configuration of FIG. 8C, a separate Vbody terminal is shown in the schematic diagram for flexibility, but in many applications Vbody can be tied directly to circuit ground. When Vbody is tied directly to circuit ground, all body current in the FETs M1-Mn, $M_0$ is sourced from circuit ground (e.g., $V_{GS}$=Vbody=0V). In contrast, in a conventional FET stack of the type shown in FIG. 2, body current needs to be sourced from a negative power supply (e.g., $V_{GS}$=Vbody=−3V). Such a negative power supply is usually provided by a negative charge pump, the output of which, Vss, will slump when high peak RF voltages are applied across the FET stack and induce significant body current.

In some embodiments, capacitors Cgate, Cdrain, and/or Cbody may be coupled as shown to the Vgate, Vdrain, and Vbody terminals, respectively, and to a reference potential, such as circuit ground. The Cgate, Cdrain, and/or Cbody capacitors, when present, serve to filter out RF voltage from DC bias voltages applied to those terminals (i.e., making Vgate, Vdrain, and/or Vbody AC grounds).

Figure 8D:
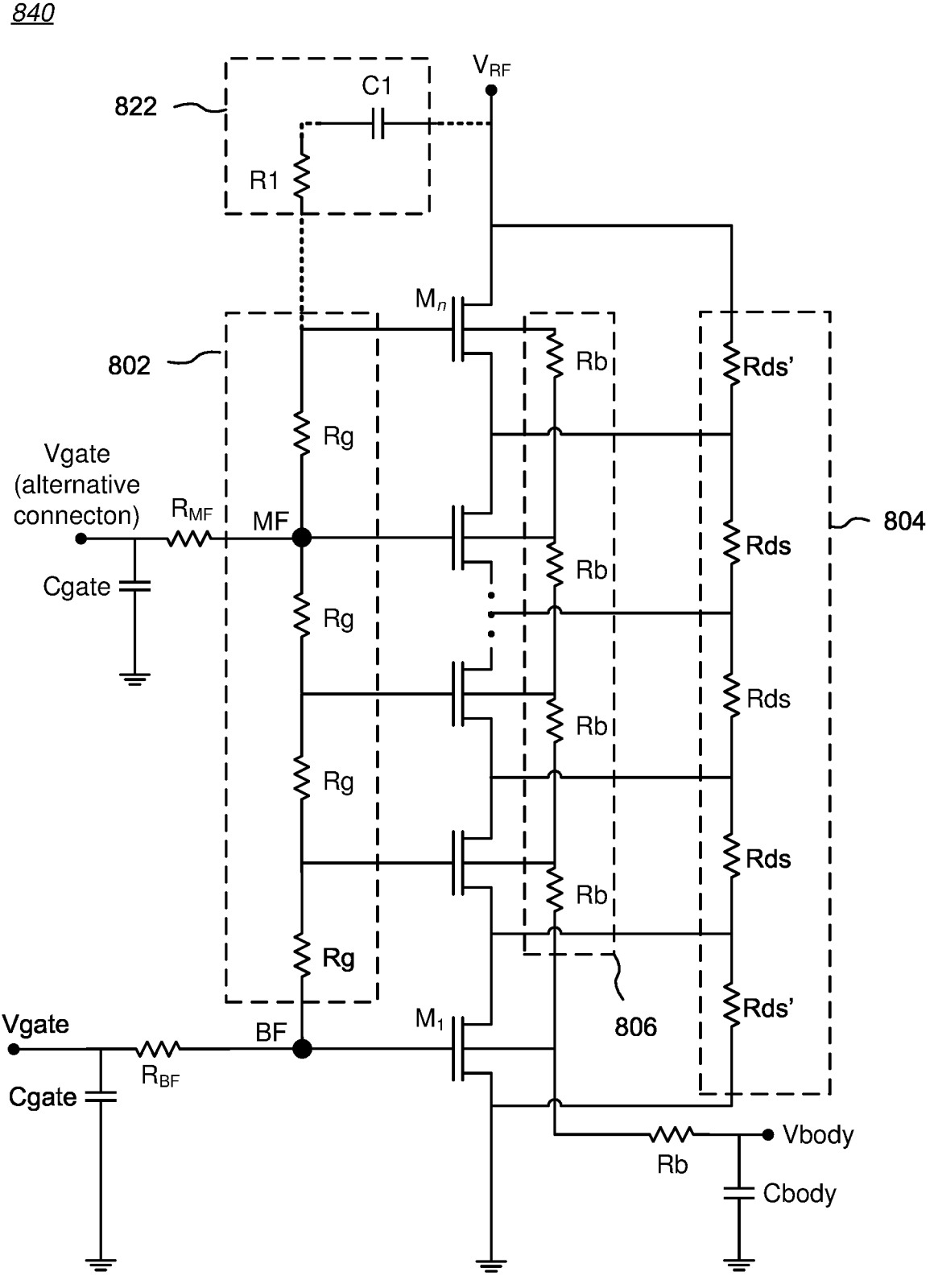
FIG. 8D is a schematic diagram of a conventional FET stack with a series-connected gate bias resistor ladder, a series-connected drain-source resistor ladder, and a series-connected body charge control resistor ladder.

The series-connected gate bias resistor ladder 802 configuration of FIG. 8A, the series-connected drain-source resistor ladder 804 of FIG. 8B, and the series-connected body charge control resistor ladder 806 of FIG. 8C are applicable to conventional FET stacks (e.g., of the types shown in FIG. 2 or 3), as well as to FET switch stacks having one or more end-cap $M_0$ FETs (i.e., FETs that turn OFF when their $V_{GS}$ is essentially zero volts). For example, FIG. 8D is a schematic diagram of a conventional FET stack 840 with a series-connected gate bias resistor ladder 802, a series-connected drain-source resistor ladder 804, and a series-connected body charge control resistor ladder 806. In contrast to the embodiment of FIG. 8C, the "end-cap" FETs M1 and Mn are conventional FETS, additional drain-source resistors Rds' have been added to the drain-source resistor ladder 804 in order to span the drain and source of each of M1 and Mn, the optional capacitors Cd from FIG. 8C have been removed, and there is no Vdrain bias voltage. This configuration has the advantages for each series-connected resistor ladder 802, 804, 806 noted above for the series-connected gate bias resistor ladder 802, especially protection from breakdown due to excessive capacitively coupled RF voltages.

Figure 8E:
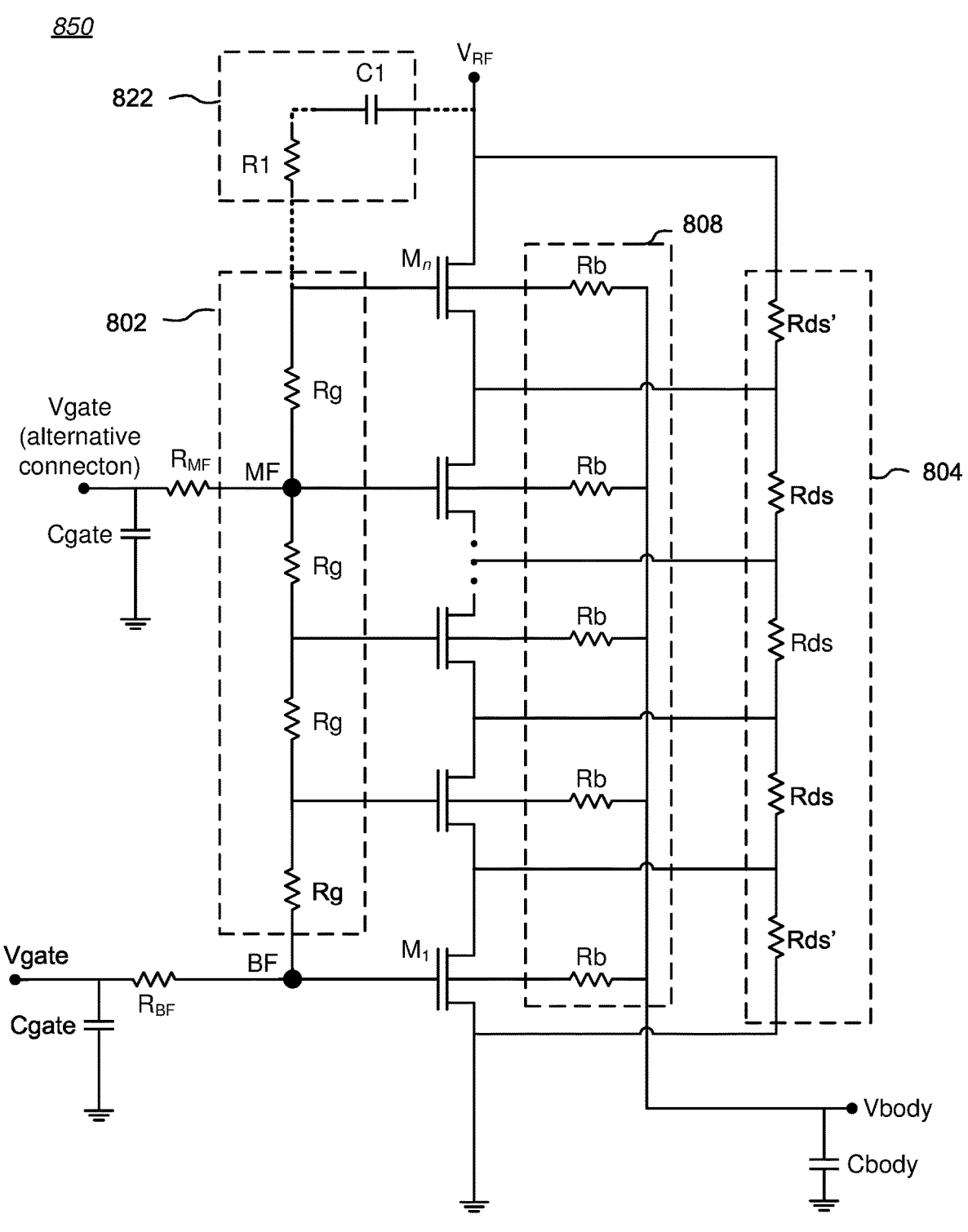
FIG. 8E is a schematic diagram of a conventional FET stack with a series-connected gate bias resistor ladder, a series-connected drain-source resistor ladder, and a parallel-connected body charge control resistor ladder.

In some embodiments, the series-connected body charge control resistor ladder 806 may be replaced by a parallel-connected body charge control resistor ladder, either in a conventional FET stack or in a FET stack having one or more end-cap $M_0$ FETs. For example, FIG. 8E is a schematic diagram of a conventional FET stack 850 with a series-connected gate bias resistor ladder 802, a series-connected drain-source resistor ladder 804, and a parallel-connected body charge control resistor ladder 808. This parallel-connected approach may prove to be advantageous if the body current for a series-connected resistor ladder configuration (as in FIG. 8D) would be high enough that the cumulative IR drop would cause the voltage on the body of the "top" FET Mn (i.e., the FET furthest from the input node for the bias voltage Vbody) to become undesirably high. The parallel-connected body charge control resistor ladder 808 configuration creates a consistent voltage drop across the body resistors Rb such that there is no additive voltage increase.

In an optional configuration, an additional parallel-connected gate resistor ladder (not shown, but essentially the same as the parallel-connected gate resistor ladder 805 of FIG. 8C) may be included. In some embodiments, the configuration of the body charge control resistor ladder may be series-connected (as in FIG. 8D) and the configuration of the gate bias resistor ladder may be parallel-connected (as in FIG. 4) or a combination of series-connected and parallel-connected (as in FIG. 8B, with the added parallel-connected gate resistor ladder 805), with benefits similar to those described above for FIG. 8E.

As should be appreciated, any combination of series-connected resistor ladders 802, 804, 806 may be used in conjunction with a FET stack, with or without adding a parallel-connected gate resistor ladder 805 or substituting a parallel-connected body charge control resistor ladder 808 for a series-connected resistor ladder 806. Examples include: a gate bias resistor ladder plus a body charge control resistor ladder; a gate bias resistor ladder plus a drain-source resistor ladder; a body charge control resistor ladder plus a drain-source resistor ladder; and a gate bias resistor ladder plus a body charge control resistor ladder plus a drain-source resistor ladder.

If more than one resistor ladder is used in a FET stack that includes end-cap $M_0$ FETs, it may be necessary or useful to provide a non-overlapping sequencing for states changes to the Vgate, Vdrain, and Vbody voltages to help prevent "shoot through" DC current in the end-cap $M_0$ FETs. Such current may occur because the positive-logic FETs (e.g., FETs M1-Mn in FIG. 4) have different ON-to-OFF and OFF-to-ON switching characteristics and timing compared to the essentially zero $V_{GS}$ $M_0$ FETs. For example, referring to FIG. 8C, when the FET stack is being switched from the OFF state to the ON state, it may be preferable to change Vdrain (e.g., from 3V to 0V) before changing Vgate (e.g., from 0V to 3V). Conversely, when the FET stack is being switched from the ON state to the OFF state, it may be preferable to change Vgate (e.g., from 3V to 0V) before changing Vdrain (e.g., from 0V to 3V).

Bias Ladders with AC Coupling Modules

The series-connected or series/parallel connected gate resistor ladders described above allow the gate of each FET in a switch stack to track the common mode voltage of its associated FET. In general, such gate resistor ladders must provide a high impedance relative to the impedance (capacitance) between the gate and the source/drain of the FETs in the switch stack. Despite the benefits of a series-connected gate bias resistor ladder 802 (e.g., as shown in FIG. 8A) or of a combination of series-connected gate bias resistor ladder 802 and a parallel-connected gate bias resistor ladder 805 (e.g., as shown in FIG. 8B) as described to this point, in some applications, the FET nearest an applied RF signal (e.g., the "top" FET in FIGS. 8B-8E coupled to V$_{RF}$) still has an effective RF load that can cause the gate of that FET to not fully track the transistor common mode voltage during RF operation. The RF load on the gate of the "top" FET acts as parasitic capacitance in producing non-ideal voltage division, and if not compensated, can reduce the peak breakdown voltage (BV) withstand capability of that FET by several percent.

However, the load seen by that "top" FET can be substantially mitigated or even totally eliminated by coupling an AC Coupling Gate Module 822 between an RF input terminal and the gate of the FET (through at least a gate resistor) in the stack nearest the RF input terminal. For example, in FIGS. 8B-8E, an AC Coupling Gate Module 822 is coupled between the terminal receiving a V$_{RF}$ signal and the gate of the "top" FET (Mn or M$_0$, as the case may be)—thus, the AC Coupling Gate Module 822 is also coupled to the "top" of the series-connected gate bias resistor ladder 802.

Figure 8F:
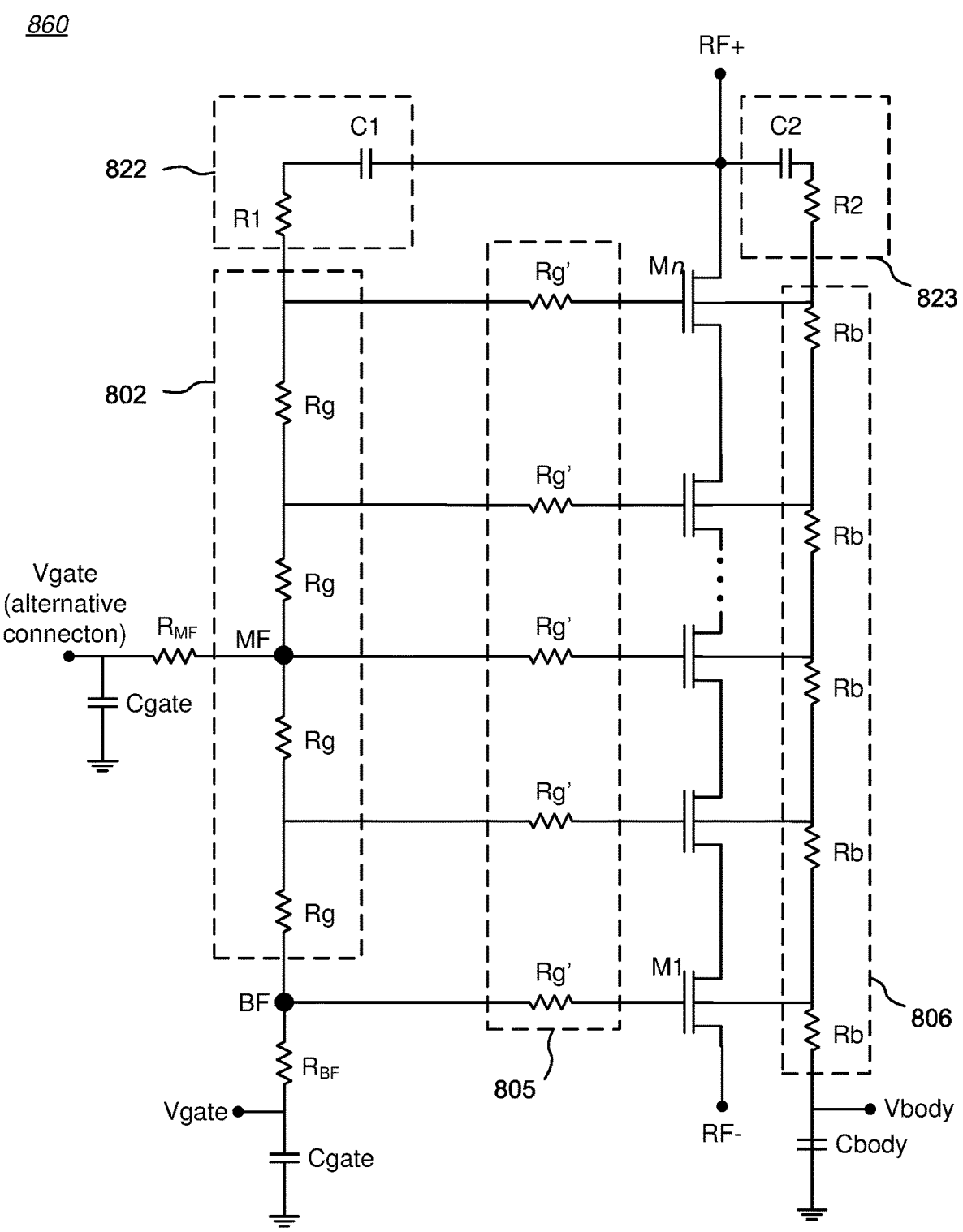
FIG. 8F is a schematic diagram of a conventional FET stack with a series-connected gate bias resistor ladder and an AC Coupling Gate Module.

As another example, FIG. 8F is a schematic diagram of a conventional FET stack 860 with a series-connected gate bias resistor ladder 802 and an AC Coupling Gate Module 822. The FET stack 860 is configured to be coupled in a shunt configuration or in a series configuration. In a shunt configuration, the RF– terminal is usually circuit ground, an RF input signal is applied at the RF+ terminal, and Vgate is applied at the "bottom" of the FET stack 860 through resistor R$_{BF}$. In a series configuration, either or both of the RF+ and RF– terminals may be the source of an RF signal (e.g., RF+ may be coupled between an RF antenna and an amplifier), and Vgate would generally be applied at the "middle" of the FET stack 860 through resistor R$_{MF}$. As noted above, a "middle feed" configuration can provide a reduction in power dissipation in the gate resistors Rg regardless of whether an RF voltage amplitude is applied at either end of the FET stack 860. As should be clear, the FETs M1-Mn of the conventional FET stack 860 of FIG. 8F can be replaced by a positive logic stack of the type shown in FIG. 8B.

In some embodiments, the AC Coupling Gate Module 822 may comprise a DC blocking capacitor C1, while in other embodiments the AC Coupling Gate Module 822 may comprise a DC blocking capacitor C1 connected in series with a resistor R1 (the order of connection of C1 and R1 does not matter, whereas the order of connection does matter for Cgate and R$_{BF}$ at the "bottom" of the stack for a shunt stack configuration). The AC Coupling Gate Module 822 improves voltage division along the gate bias resistor ladder 802 and allows the gate of the "top" FET to more fully track the transistor common mode voltage during RF operation. Another benefit of the AC Coupling Gate Module 822 in a series configuration is that it lets a coupled antenna be loaded directly, rather than through the FETs of the stack.

Figure 8G:
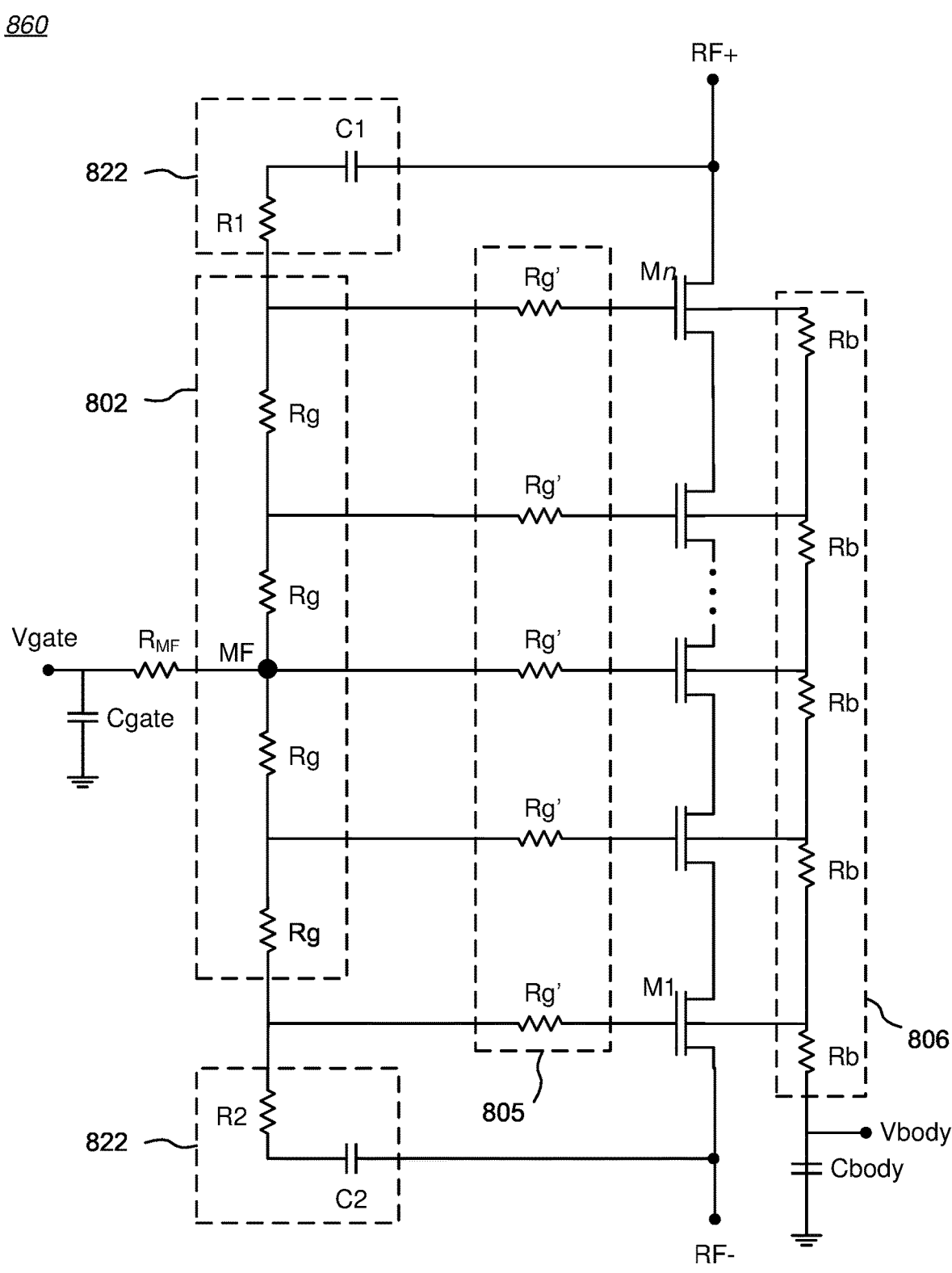
FIG. 8G is a schematic diagram of a conventional FET stack with a series-connected gate bias resistor ladder and dual AC Coupling Gate Modules.

As noted above, in a series configuration, either or both of the RF+ and RF– terminals may be the source of an RF signal, and Vgate would generally be applied at the "middle" of the FET stack 860 through resistor R$_{MF}$. In such a case, it may be beneficial to couple a Coupling Gate Module between the series-connected gate bias resistor ladder 802 and both of the RF+ and RF-terminals. For example, FIG. 8G is a schematic diagram of a conventional FET stack 870 with a series-connected gate bias resistor ladder 802 and dual AC Coupling Gate Modules. The FET stack 870 of FIG. 8G is similar to the FET stack 860 of FIG. 8F, but with a "middle feed" configuration for Vgate, a first AC Coupling Gate Module 822 at the "top" of the stack nearest FET Mn, and a second AC Coupling Gate Module 822' at the "bottom" of the stack nearest FET M1. The second AC Coupling Gate Module 822' may comprise a DC blocking capacitor C2, while in other embodiments the second AC Coupling Gate Module 822' may comprise a DC blocking capacitor C2 connected in series with a resistor R2. With the illustrated configuration of AC Coupling Gate Modules 822, 822', the load seen by the FETs nearest the RF+ and RF– terminals can be substantially mitigated or even totally eliminated.

Referring back to FIG. 8F, if a series-connected body charge control resistor ladder 806 is included in the FET stack 860, a similar AC Coupling Body Module 823 will provide the same benefits for the body (or "back gate") of the "top" FET (in this example, FET Mn, nearest the RF+ terminal). In the illustrated embodiment, the AC Coupling Body Module 823 is coupled between the RF+ terminal and the series-connected body charge control resistor ladder 806 connected to the "top" FET Mn nearest the RF+ terminal. The AC Coupling Body Module 823 may comprise a DC blocking capacitor C2 in some embodiments, while in other embodiments the AC Coupling Body Module 823 may comprise a DC blocking capacitor C2 connected in series with a resistor R2 (again, the order of connection does not matter). Further, in a series configuration, a second AC Coupling Body Module (not shown) may be coupled between the RF– terminal and the series-connected body charge control resistor ladder 806 connected to the "bottom" FET M1 nearest the RF– terminal to provide similar benefits.

An AC Coupling Gate Module and an AC Coupling Body Module may be used independently of each other, or may be used together. In general, when using a series-connected gate bias resistor ladder 802 and/or a series-connected body charge control resistor ladder 806, there are significant benefits to using an AC Coupling Gate and/or Body Module between the respective ladders 802, 806 and any RF terminal presenting an RF load, in order to mitigate or even totally eliminate an RF load across the FET coupled to that RF terminal.

In some embodiments, a parallel-connected gate bias ladder 805 may be included with the values of the resistors Rg' being selected to isolate for a different voltage division in the gate bias resistor ladders versus the component FETs M1-Mn of the FET stack 860. More particularly, if the voltage division across the FET stack 860 is uniform, then constant Rg values for a series-connected gate bias resistor ladder 802 (i.e., a "rail" only configuration) in conjunction with an AC Coupling Gate Module 822 completely eliminates the RF load on the FETs since the voltage division across the gate bias resistor ladder is uniform. On the other hand, if there is non-ideal voltage division across the FET stack 860, a mismatch occurs between the voltage division across the FETs and the voltage division across the rail-only gate bias resistor ladder. This can be remedied by including a parallel-connected gate bias ladder 805 (i.e., adding "rungs" to the "rails" of the series-connected gate bias resistor ladder 802). Adding rung resistors Rg' helps reduce the RF load due to non-ideal voltage division across the FET stack 860, with minimal switching time constant penalty.

In some gate bias ladder embodiments having a series-connected gate bias resistor ladder 802 (a "rail" configuration) and a parallel-connected gate bias ladder 805 (a "rung" configuration), there is a benefit to having variable values for the resistors of either or both of the "rail" and "rung" bias resistor ladders 802, 805 (as opposed to constant resistance values). In general, the variation should be tapered from the top of the FET stack to the bottom; that is, the resistor values in one or both of the bias resistor ladders 802, 805 should be higher near the top, tapering to lower at the bottom. For example, compared to constant value rail and rung resistors, there is significant improvement in peak breakdown voltage (BV) for the top-most transistor (nearest the RF signal input) when the rail resistors are variable and the rung resistors are constant, while retaining similar switching time and power dissipation characteristics. In addition, a "variable rail/constant rung" gate bias resistor ladder configuration allows the size of the rung resistors to be much smaller than with other configurations, enabling greater flexibility in designing IC layouts. Similar benefits may be seen in embodiments using a "variable rail/variable rung" gate bias resistor ladder configuration. Note that variable rail resistor values may be adjusted to achieve a desired relationship of (1) the RF load on the FET gates to (2) the peak BV for the top-most transistor. However, there is a tradeoff with the switching time constant.

Note that when the FET stack 860 is coupled to an antenna or the like, then the resistance of R1 is preferably set to one-half of the resistance of the series-connected resistors Rg (i.e., R1=½ Rg), since the gate of the "top" FET sees only one-half the voltage below the antenna compared to the voltage across each other FET.

Notably, the inclusion of the AC Coupling Gate Module 822 and/or the AC Coupling Body Module 823 has essentially no adverse effect on the performance characteristics of the FET stack 860 (e.g., in terms of switching time constant, resistor power dissipation, resistive voltage drop through body resistors due to body current, etc.). On the other hand, the inclusion of one or more of such modules 822, 823 substantially eliminates the reduction in the peak breakdown voltage (BV) withstand capability of the "top" FET of the FET stack that would otherwise occur. As one specific example, using modeled circuits to compare (1) a FET stack configuration using a series-connected gate bias resistor ladder 802 but no AC Coupling Gate Module 822 against (2) a FET stack configuration using a series-connected gate bias resistor ladder 802 and an AC Coupling Gate Module 822, the former configuration showed a decrease in BV withstand capability of the "top" FET of about 0.714, while the latter configuration showed a decrease in BV withstand capability of the "top" FET of about 0.001—a factor of over 700 in improvement due to the AC Coupling Gate Module 822.

Note that in a series configuration for the FET stack 860, where either or both of the RF+ and RF− terminals may be the source of an RF signal, an AC Coupling Gate Module 822 may be coupled between a terminal RF+, RF− and a respective end of the series-connected gate bias resistor ladder 802 for the FET stack 860. In such a case, Vgate would normally be applied to the FET stack 860 using a "middle feed" configuration. Similarly, an AC Coupling Body Module 823 may be coupled to each end of the body charge control resistor ladder 806 for the FET stack 860.

Accumulated Charge Sink Structure

Embodiments of the invention, including the embodiments described above, that are fabricated using silicon-oninsulator (SOI)—including silicon-on-sapphire (SOS) MOSFETs—may benefit by adding an accumulated charge sink (ACS) structure to one or more constituent FETs (i.e., M1-Mn and/or $M_0$). In particular, the linearity of an SOI MOSFET can be improved by providing a means for sweeping out accumulated charge trapped below the gate oxide of the MOSFET, such as by use of the "HaRP"™ accumulated charge sink (ACS) technology taught in U.S. Pat. No. 7,910,993, issued Mar. 22, 2011, entitled "*Method and Apparatus for use in Improving Linearity of MOSFETs Using an Accumulated Charge Sink*", which is hereby incorporated by reference. An "accumulated charge", as defined in more detail in U.S. Pat. No. 7,910,993 and as used herein, refers to gate-bias induced carriers that may accumulate in the body of an OFF-state MOSFET, even if the majority carriers in the body do not have the same polarity as the accumulated charge.

More particularly, as described in greater detail in U.S. Pat. No. 7,910,993, no matter what mode of operation an SOI MOSFET employs (i.e., whether enhancement or depletion mode), when the MOSFET is operated in an OFF-state (i.e., the gate voltage does not exceed $V_{th}$), and when a sufficient nonzero gate bias voltage is applied with respect to the MOSFET source and drain, an "accumulated charge" may occur under the MOSFET gate which adversely affects the linearity and other aspects of the performance of the MOSFET. To alleviate the effects of such accumulated charge, an SOI MOSFET may include an ACS structure that allows discharge of accumulated charge when the MOSFET is in a non-conducting (OFF) mode while allowing normal operation when the MOSFET is in a conducting (ON) mode.

Figure 8H:
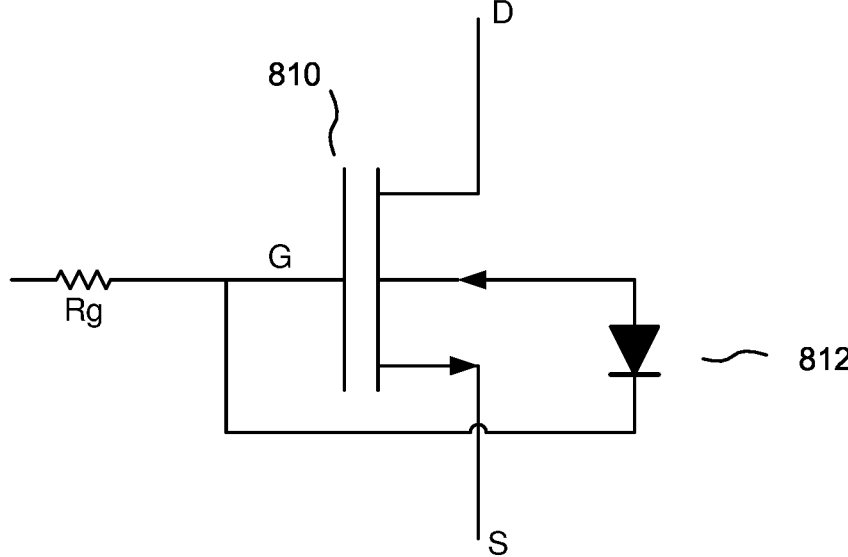
FIG. 8H is a simplified schematic diagram of an SOI MOSFET that includes an ACS structure along with conventional drain D, source S, and gate G terminals and a gate resistor Rg.

FIG. 8H is a simplified schematic diagram of an SOI MOSFET 810 that includes an ACS structure along with conventional drain D, source S, and gate G terminals and a gate resistor Rg. In this particular illustrated example, the ACS structure comprises a diode 812 coupled from the body of the MOSFET 810 to the gate G of the MOSFET 810. The diode 812 discharges accumulated charge from the body of the MOSFET 810 through the gate G when the MOSFET 810 is in a non-conducting (OFF) mode, while allowing normal operation when the MOSFET 810 is in a conducting (ON) mode. Alternative ACS structure circuits and methods for reducing accumulated charge in floating body semiconductor devices are described in greater detail in U.S. Pat. No. 7,910,993 referenced above. The MOSFET 810 along with an ACS structure (e.g., a body-to-gate diode 812) may also be referred to as an "ACS FET". As should be clear, in an SOI MOSFET stack comprising one or more series-coupled positive-logic MOSFETs M1-Mn (i.e., FETs not requiring a negative voltage supply to turn OFF), coupled to one or more series-coupled "end-cap" $M_0$ MOSFETs, one or more of the MOSFETs may be ACS FETs.

Methods

Note that in specifying a particular circuit embodiment having the architecture and characteristics of the example circuits described above, the principal of "superposition" may be used as a method for optimizing DC biasing and best AC voltage handling configuration independently, and then combining the results. That is, one can first define an optimum circuit configuration independently for AC behavior and DC behavior, and then overlay and merge the two solutions. Mathematically, superposition may be expressed as $f(DC+AC)=f(DC)+f(AC)$, where "DC" is the DC behavior of the circuit, and "AC" is the AC behavior of the circuit.

Figure 9:
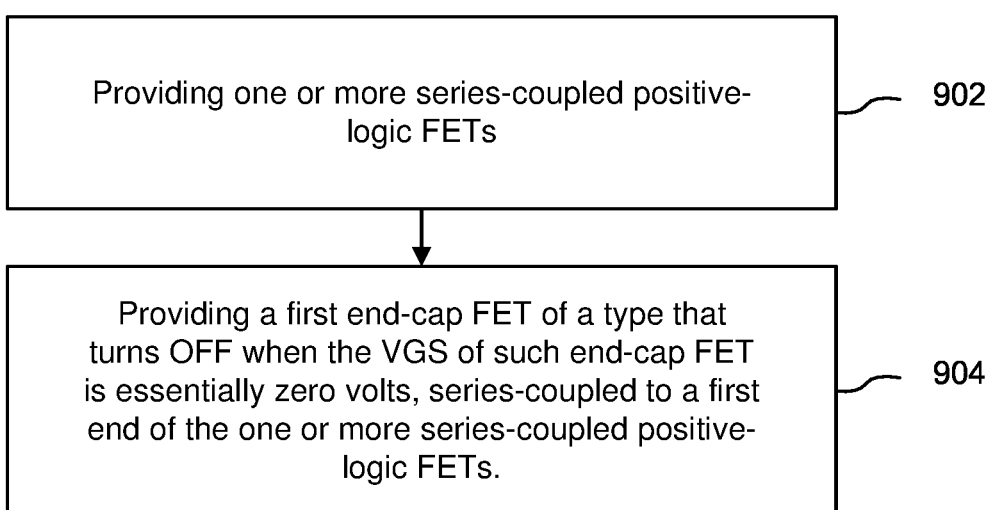
FIG. 9 is a process flow diagram showing one method for providing a FET switch stack.

Another aspect of the invention includes methods for providing a FET switch stack. For example, FIG. 9 is a process flow diagram 900 showing one method for providing a FET switch stack. The method includes: providing one or more series-coupled positive-logic FETs (STEP 902); and providing a first end-cap FET of a type that turns OFF when the $V_{GS}$ of such end-cap FET is essentially zero volts, series-coupled to a first end of the one or more series-coupled positive-logic FETs (STEP 904).

Additional aspects of the method of FIG. 9 may include one or more of the following: providing a second end-cap FET of a type that turns OFF when the $V_{GS}$ of such end-cap FET is essentially zero volts, series-coupled to a second end of the one or more series-coupled positive-logic FETs; further including series coupling, to the FET switch stack, at least one additional FET of the type that turns OFF when the $V_{GS}$ of such FET is essentially zero volts; wherein each end-cap FET functions as a DC blocking capacitor when in an OFF state, and as a resistive signal path when in an ON state; further including coupling at least one capacitor between the source and the drain of a corresponding end-cap FET; further including providing a gate bias resistor ladder including a plurality of series-coupled resistors configured to be coupled to a gate bias voltage, wherein each resistor is coupled to the respective gates of corresponding adjacent FETs; further including a capacitor coupled between the gate bias resistor ladder and a reference potential; further including coupling an AC coupling gate module to at least one end of the gate bias resistor ladder and configuring the AC coupling gate module to be coupled to a radio frequency voltage source; wherein the AC coupling gate module includes one of a capacitor or a capacitor series coupled to a resistor; further including providing a body charge control resistor ladder including a plurality of series-coupled or parallel-coupled resistors configured to be coupled to a body bias voltage, wherein each resistor is coupled to the body of at least one corresponding FET; further including a capacitor coupled between the body charge control resistor ladder and a reference potential; further including coupling an AC coupling body module to at least one end of the body charge control resistor ladder, the AC coupling body module configured to be coupled to a radio frequency voltage source; wherein the AC coupling body module includes one of a capacitor or a capacitor series coupled to a resistor; further including providing a drain-source resistor ladder including a plurality of series-coupled resistors configured to be coupled to a drain-source bias voltage, wherein each resistor is coupled to the respective drains and sources of corresponding adjacent positive-logic FETs; further including coupling a negative gate bias voltage supply to the gates of the end-cap FETs; and wherein at least one FET is an ACS FET.

As another method example, FIG. 10 is a process flow diagram 1000 showing one method for providing a series-shunt switch circuit. The method includes: providing a series FET switch stack having an input port configured to be coupled in series with an RF signal line, and an output port (STEP 1002); coupling a shunt FET switch stack to the output port of the series FET switch stack (STEP 1004); configuring the shunt FET switch stack to be coupled to a reference potential (STEP 1006); wherein the series FET switch stack and the shunt FET switch stack have at least one end-cap FET that turns OFF when the $V_{GS}$ of such end-cap FET is essentially zero volts (STEP 1008), or wherein the series FET switch stack and the shunt FET switch stack include at least one series-coupled positive-logic FET, series-coupled to at least one end-cap FET of a type that turns OFF when the $V_{GS}$ of such end-cap FET is essentially zero volts (STEP 1010).

As yet another method example, FIG. 11 is a process flow diagram 1100 showing one method for biasing a FET switch stack. The method includes: providing a plurality of series-coupled FETs (STEP 1102); providing a gate bias resistor ladder including a plurality of resistors configured to be coupled to a gate bias voltage and to the gates of at least one corresponding FET (STEP 1104); providing a body charge control resistor ladder including a plurality of resistors configured to be coupled to a body bias voltage and to the body of at least one corresponding FET (STEP 1106); and providing a drain-source resistor ladder including a plurality of series-coupled resistors configured to be coupled to a drain-source bias voltage, wherein each resistor is coupled to the respective drains and sources of at least one corresponding adjacent FET (STEP 1108); and wherein the resistors of the gate bias resistor ladder are series-connected and the resistors of the body charge control resistor ladder are parallel-connected (STEP 1110), or alternatively, wherein the resistors of the gate bias resistor ladder are parallel-connected and the resistors of the body charge control resistor ladder are series-connected (STEP 1112).

Additional aspects of the method of FIG. 11 may include one or more of the following: wherein the plurality of series-coupled FETs includes one or more series-coupled positive-logic FET, series-coupled on at least one end to an end-cap FET of a type that turns OFF when the $V_{GS}$ of such end-cap FET is essentially zero volts; further including a second end-cap FET of a type that turns OFF when the $V_{GS}$ of such end-cap FET is essentially zero volts, series-coupled to a second end of the one or more series-coupled positive-logic FETs; coupling a capacitor between the gate bias resistor ladder and a reference potential; coupling an AC coupling gate module to at least one end of the gate bias resistor ladder and configuring the AC coupling gate module to be coupled to a radio frequency voltage source; wherein the AC coupling gate module includes one of a capacitor or a capacitor series coupled to a resistor; further including coupling an AC coupling body module coupled to at least one end of the body charge control resistor ladder and configuring the AC coupling gate module to be coupled to a radio frequency voltage source; wherein the AC coupling body module includes one of a capacitor or a capacitor series coupled to a resistor; coupling a capacitor between the body charge control resistor ladder and a reference potential; configuring the gate bias resistor ladder to be coupled to a bias voltage at a node at a first end of the gate bias resistor ladder; configuring the gate bias resistor ladder to be coupled to a bias voltage at a node between a first end and a second end of the gate bias resistor ladder; wherein at least one FET is an ACS FET; further including coupling a parallel-connected gate resistor ladder, including a plurality of resistors, between the gate bias resistor ladder and the gates of corresponding FETs; wherein the plurality of series-coupled FETs includes at least one series-coupled positive-logic FET, bracketed by series-coupled end-cap FETs of a type that turn OFF when the $V_{GS}$ of such end-cap FETs is essentially zero volts; and wherein the plurality of series-coupled FETs includes a first end-cap FET of a type that turns OFF when the $V_{GS}$ of such end-cap FET is essentially zero volt, a second end-cap FET of a type that turns OFF when the $V_{GS}$ of such end-cap FET is essentially zero volts, and one or more series-coupled positive-logic FETs, series coupled between the first end-cap FET and the second end-cap FET.

As still another method example, FIG. 12 is a process flow diagram 1200 showing a method for providing a FET switch stack. The method includes: providing a plurality of series-coupled FETs (STEP 1202); coupling a gate bias resistor ladder to the gates of the series-coupled FETs (STEP 1204); coupling an AC coupling gate module to at least one end of the gate bias resistor ladder and configuring the AC coupling gate module to be coupled to a corresponding radio frequency voltage source (STEP 1206); optionally, coupling a body charge control resistor ladder to the bodies of the series-coupled FETs (STEP 1208); and, optionally, coupling an AC coupling body module to at least one end of the body charge control resistor ladder and configured to be coupled to the corresponding radio frequency voltage source (STEP 1210).

Additional aspects of the method of FIG. 12 may include one or more of the following: wherein the plurality of series-coupled FETs includes one or more series-coupled positive-logic FET, series-coupled on at least one end to an end-cap FET of a type that turns OFF when the $V_{GS}$ of such end-cap FET is essentially zero volts; further including providing a second end-cap FET of a type that turns OFF when the VGS of such end-cap FET is essentially zero volts, series-coupled to a second end of the one or more series-coupled positive-logic FETs; further including providing a drain-source resistor ladder including a plurality of series-coupled resistors configured to be coupled to a drain-source bias voltage, wherein each resistor is coupled to the respective drains and sources of corresponding adjacent positive-logic FETs; wherein the gate bias resistor ladder includes a plurality of series-connected resistors; wherein the body charge control resistor ladder includes a plurality of series-connected resistors; wherein the AC coupling gate module includes one of a capacitor or a capacitor series coupled to a resistor; wherein the AC coupling body module includes one of a capacitor or a capacitor series coupled to a resistor; wherein the gate bias resistor ladder is configured to be coupled to a bias voltage at a node at a first end of the gate bias resistor ladder; wherein the gate bias resistor ladder is configured to be coupled to a bias voltage at a node between a first end and a second end of the gate bias resistor ladder; and wherein at least one FET is an ACS FET.

Figure 13:
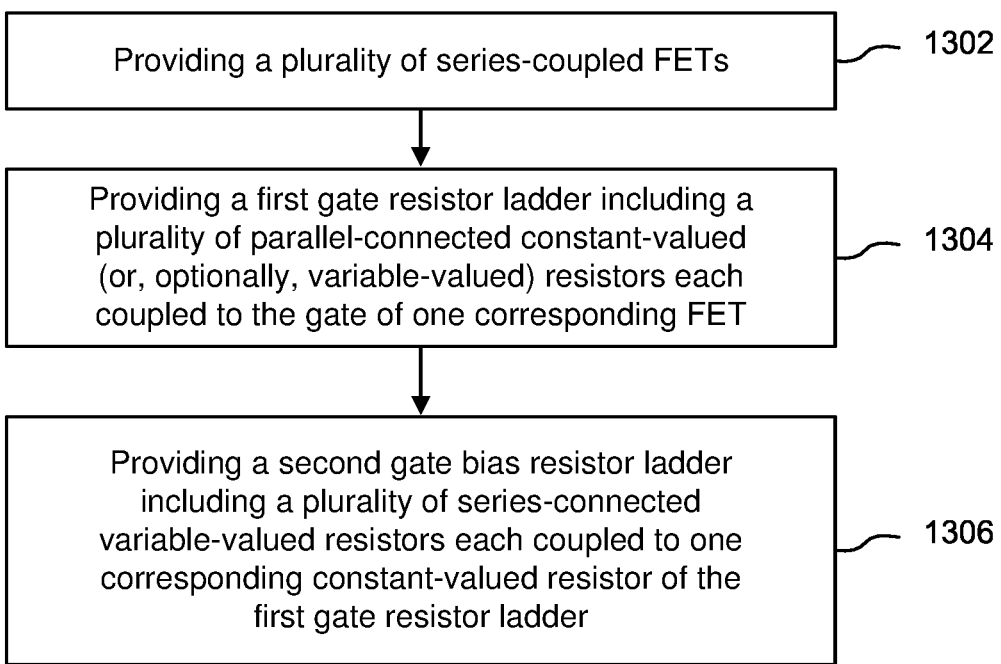
FIG. 13 is a process flow diagram showing another method for biasing a FET switch stack.

As yet another method example, FIG. 13 is a process flow diagram 1300 showing another method for biasing a FET switch stack. The method includes: providing a plurality of series-coupled FETs (STEP 1302); providing a first gate resistor ladder including a plurality of parallel-connected constant-valued (or, optionally, variable-valued) resistors each coupled to the gate of one corresponding FET (STEP 1304); and providing a second gate bias resistor ladder including a plurality of series-connected variable-valued resistors each coupled to one corresponding constant-valued resistor of the first gate resistor ladder (STEP 1306).

Fabrication Technologies & Options

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted, or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components to withstand greater voltages as described above, and/or using multiple components in parallel to handle greater currents. Additional circuit components may be added to enhance the capabilities of the disclosed circuits and/or to provide additional functional without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A method of biasing a field-effect transistor (FET) switch stack, the method comprising:

providing a plurality of series-coupled FETs, wherein each FET of the plurality of series-coupled FETs comprises a gate, wherein the plurality of series-coupled FETs comprises one or more series-coupled positive-logic FETs requiring a relative negative $V_{GS}$ to effectively turn OFF but configured to not require a negative voltage source, wherein the one or more series-coupled positive logic FETs are series-coupled on at least one end to an end-cap FET configured to turn OFF when the $V_{GS}$ of the end-cap FET is essentially zero volts;

coupling a first gate bias resistor ladder to the plurality of series-coupled FETs, the first gate bias resistor ladder comprising a plurality of parallel-coupled constant-valued resistors, wherein each constant-valued resistor of the first gate bias resistor ladder is coupled to the gate of one corresponding FET of the plurality of series-coupled FETs; and coupling a second gate bias resistor ladder to the first gate bias resistor ladder, the second gate bias resistor ladder comprising a plurality of series-coupled variable-valued resistors, wherein each variable-valued resistor of the second gate bias resistor ladder is coupled to one corresponding constant-valued resistor of the first gate bias resistor ladder.

2. The method of claim 1, further comprising configuring the second gate bias resistor ladder to be coupled to a bias voltage at a node at a first end of the second gate bias resistor ladder.

3. The method of claim 1, further comprising configuring the second gate bias resistor ladder to be coupled to a bias voltage at a node between a first end and a second end of the second gate bias resistor ladder.

4. The method of claim 1, further comprising providing a second end-cap FET configured to turn OFF when the $V_{GS}$ of the second end-cap FET is essentially zero volts, wherein the second end-cap FET is series-coupled to a second end of the one or more series-coupled positive-logic FETs.

5. The method of claim 1, further comprising:

coupling an AC coupling gate module to at least one of the first gate bias resistor ladder or the second gate bias resistor ladder; and configuring the AC coupling gate module to be coupled to a radio frequency voltage source.

6. The method of claim 1, wherein at least one FET of the plurality of series-coupled FETs is an accumulated charge sink (ACS) FET.

7. A method of biasing a field-effect transistor (FET) switch stack, the method comprising:

providing a plurality of series-coupled FETs, wherein each FET of the plurality of series-coupled FETs comprises a gate, wherein the plurality of series-coupled FETs comprises one or more series-coupled positive-logic FETs requiring a relative negative $V_{GS}$ to effectively turn OFF but configured to not require a negative voltage source, wherein the one or more series-coupled positive logic FETs are series-coupled on at least one end to an end-cap FET configured to turn OFF when the $V_{GS}$ of the end-cap FET is essentially zero volts;

coupling a first gate bias resistor ladder to the plurality of series-coupled FETs, the first gate bias resistor ladder comprising a plurality of parallel-coupled variable-valued resistors, wherein each variable-valued resistor of the first gate bias resistor ladder is coupled to the gate of one corresponding FET of the plurality of series-coupled FETs; and coupling a second gate bias resistor ladder to the first gate bias resistor ladder, the second gate bias resistor ladder comprising a plurality of series-coupled constant-valued resistors, wherein each constant-valued resistors of the second gate bias resistor ladder is coupled to one corresponding variable-valued resistor of the first gate bias resistor ladder.

8. The method of claim 7, further comprising configuring the second gate bias resistor ladder to be coupled to a bias voltage at a node at a first end of the second gate bias resistor ladder.

9. The method of claim 7, further comprising configuring the second gate bias resistor ladder to be coupled to a bias voltage at a node between a first end and a second end of the second gate bias resistor ladder.

10. The method of claim 7, further comprising providing a second end-cap FET configured to turn OFF when the $V_{GS}$ of the second end-cap FET is essentially zero volts, wherein the second end-cap FET is series-coupled to a second end of the one or more series-coupled positive-logic FETs.

11. The method of claim 7, further comprising:

coupling an AC coupling gate module to at least one of the first gate bias resistor ladder or the second gate bias resistor ladder; and configuring the AC coupling gate module to be coupled to a radio frequency voltage source.

12. The method of claim 7, wherein at least one FET of the plurality of series-coupled FETs is an accumulated charge sink (ACS) FET.

13. A method of biasing a field-effect transistor (FET) switch stack, the method comprising:

providing a plurality of series-coupled FETs, wherein each FET of the plurality of series-coupled FETs comprises a gate, wherein the plurality of series-coupled FETs comprises one or more series-coupled positive-logic FETs requiring a relative negative $V_{GS}$ to effectively turn OFF but configured to not require a negative voltage source, wherein the one or more series-coupled positive logic FETs are series-coupled on at least one end to an end-cap FET configured to turn OFF when the $V_{GS}$ of the end-cap FET is essentially zero volts;

coupling a first gate bias resistor ladder to the plurality of series-coupled FETs, the first gate bias resistor ladder comprising a plurality of parallel-coupled variable-valued resistors, wherein each variable-valued resistor of the first gate bias resistor ladder is coupled to the gate of one corresponding FET of the plurality of series-coupled FETs; and coupling a second gate bias resistor ladder to the first gate bias resistor ladder, the second gate bias resistor ladder comprising a plurality of series-coupled variable-valued resistors, wherein each valuable-valued resistor of the second gate bias resistor ladder is coupled to one corresponding variable-valued resistor of the first gate bias resistor ladder.

14. The method of claim 13, further comprising configuring the second gate bias resistor ladder to be coupled to a bias voltage at a node at a first end of the second gate bias resistor ladder.

15. The method of claim 13, further comprising configuring the second gate bias resistor ladder to be coupled to a bias voltage at a node between a first end and a second end of the second gate bias resistor ladder.

16. The method of claim 13, further comprising providing a second end-cap FET of a type that turns OFF when the $V_{GS}$ of the second end-cap FET is essentially zero volts, wherein the second end-cap FET is series-coupled to a second end of the one or more series-coupled positive-logic FETs.

17. The method of claim 13, further comprising:

coupling an AC coupling gate module to at least one of the first gate bias resistor ladder and the second gate bias resistor ladder; and configuring the AC coupling gate module to be coupled to a radio frequency voltage source.

* * * * *